US011854927B2

(12) United States Patent
Tseng et al.

(10) Patent No.: US 11,854,927 B2
(45) Date of Patent: Dec. 26, 2023

(54) SEMICONDUCTOR PACKAGE AND METHOD OF FORMING SAME

(71) Applicant: Taiwan Semiconductor Manufacturing Co., Ltd., Hsinchu (TW)

(72) Inventors: Ting-Chen Tseng, Hsinchu (TW); Sih-Hao Liao, New Taipei (TW); Yu-Hsiang Hu, Hsinchu (TW); Hung-Jui Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 6 days.

(21) Appl. No.: 17/333,399

(22) Filed: May 28, 2021

(65) Prior Publication Data

US 2022/0310467 A1 Sep. 29, 2022

Related U.S. Application Data

(60) Provisional application No. 63/165,284, filed on Mar. 24, 2021.

(51) Int. Cl.
*H01L 23/31* (2006.01)
*H01L 23/00* (2006.01)
*H01L 21/311* (2006.01)
*H01L 21/56* (2006.01)

(52) U.S. Cl.
CPC .... *H01L 23/3185* (2013.01); *H01L 21/31133* (2013.01); *H01L 21/56* (2013.01); *H01L 24/19* (2013.01); *H01L 24/20* (2013.01); *H01L 2224/221* (2013.01)

(58) Field of Classification Search
CPC . H01L 23/3185; H01L 21/31133; H01L 21/56
See application file for complete search history.

(56) References Cited

U.S. PATENT DOCUMENTS

| 8,980,691 | B2 | 3/2015 | Lin |
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |

(Continued)

FOREIGN PATENT DOCUMENTS

| KR | 20210023345 A | 3/2021 |
| TW | 201539678 A | 10/2015 |
| TW | 202044507 A | 12/2020 |

*Primary Examiner* — Trang Q Tran
(74) *Attorney, Agent, or Firm* — Slater Matsil, LLP

(57) ABSTRACT

A package and a method forming the same are provided. The package includes an integrated circuit die. A sidewall of the integrated circuit die has a first facet and a second facet. The first facet and the second facet have different slopes. The package includes an encapsulant surrounding the integrated circuit die and in physical contact with the first facet and the second facet and an insulating layer over the integrated circuit die and the encapsulant. An upper surface of the integrated circuit die is lower than an upper surface of the encapsulant. A sidewall of the insulating layer is substantially coplanar with the first facet.

20 Claims, 21 Drawing Sheets

(56) References Cited

U.S. PATENT DOCUMENTS

| | | |
|---|---|---|
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,559,005 B2 | 1/2017 | Tsai et al. |
| 11,121,052 B2 | 9/2021 | Lai et al. |
| 11,195,774 B2 | 12/2021 | Lee |
| 2002/0027257 A1 | 3/2002 | Kinsman et al. |
| 2004/0113283 A1 | 6/2004 | Farnworth et al. |
| 2007/0083017 A1 | 4/2007 | Dueber et al. |
| 2016/0064338 A1* | 3/2016 | Miao ............... H01L 24/94 |
| | | 257/620 |
| 2017/0186655 A1 | 6/2017 | Chen |
| 2017/0323840 A1* | 11/2017 | Chiu ............... H01L 21/568 |
| 2019/0148474 A1* | 5/2019 | Bu ............... H10K 77/111 |
| | | 257/40 |
| 2019/0244947 A1 | 8/2019 | Yu et al. |
| 2020/0043891 A1 | 2/2020 | Yu et al. |
| 2020/0168464 A1* | 5/2020 | Loh ............... H01L 21/67086 |
| 2021/0098636 A1* | 4/2021 | Tai ............... H01L 24/19 |
| 2021/0294213 A1 | 9/2021 | Hirata et al. |
| 2022/0091505 A1 | 3/2022 | Liao et al. |
| 2022/0181268 A1* | 6/2022 | Kung ............... H01L 23/552 |
| 2022/0291585 A1 | 9/2022 | Shimizu et al. |

* cited by examiner

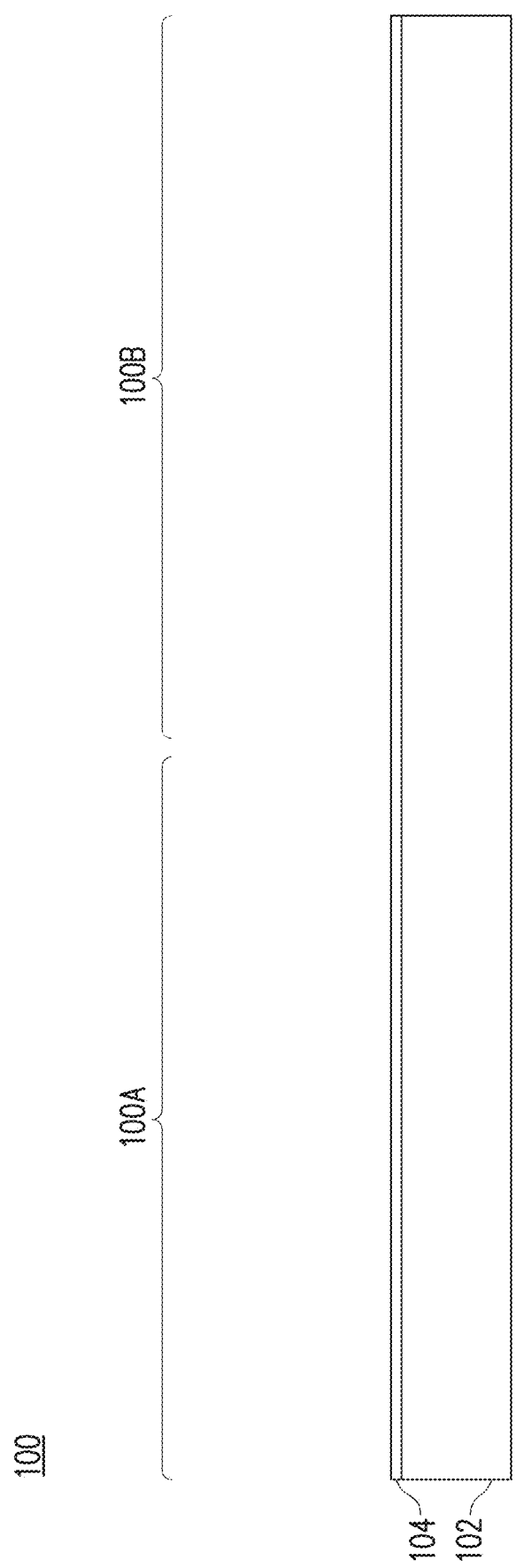

SEMICONDUCTOR PACKAGE AND METHOD OF FORMING SAME

PRIORITY CLAIM AND CROSS-REFERENCE

This application claims the benefit of U.S. Provisional Application No. 63/165,284, filed on Mar. 24, 2021, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5, 6, 7, 8, 9, 10, 11A, 12, 13, 14, 15, 16, 17A, and 17B illustrate cross-sectional views of intermediate steps during a process for forming a package component in accordance with some embodiments.

DETAILED DESCRIPTION

Figure 1:
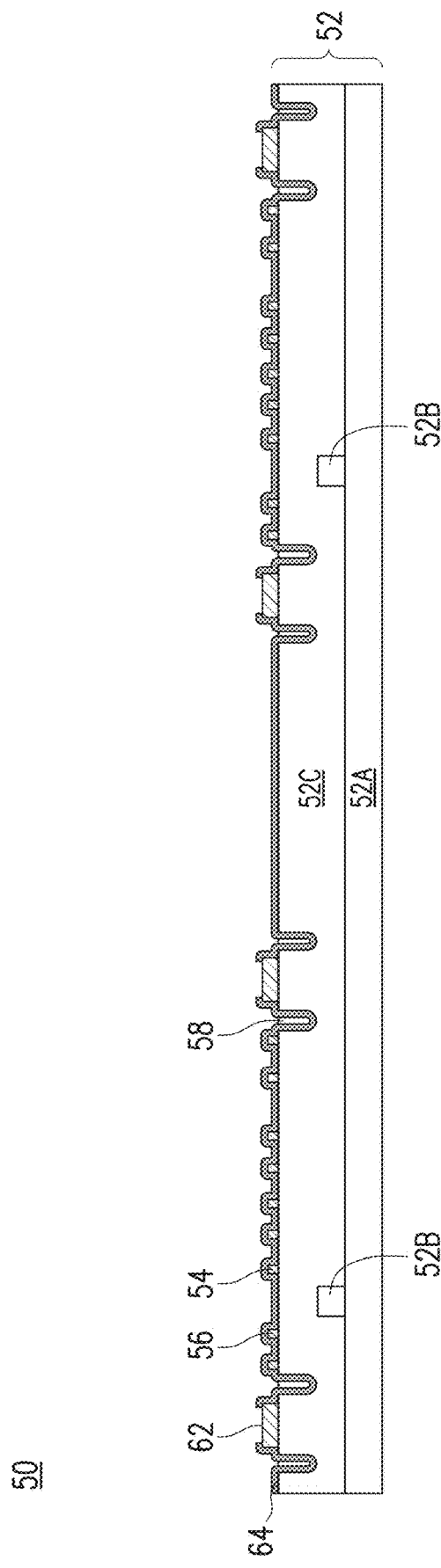
FIGS. 1, 2, 3, 4A, and 4B illustrate cross-sectional views of intermediate steps during a process for forming an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming a semiconductor package comprising a plurality of package components. An integrated circuit die (e.g., a sensor die) may include an insulating layer having a desired strength, durability, and flexibility while also having a chemical composition that may be removed quickly and efficiently in a subsequent step. The integrated circuit die may be attached to a substrate comprising a back-side redistribution structure and through vias, and an encapsulant may be formed around the integrated circuit die and the through vias. The dielectric layer may then be removed in order to form a front-side redistribution structure electrically coupled to the integrated circuit die and the through vias. This package component may then be attached to another package component to form the semiconductor package.

FIGS. 1, 2, 3, 4A, and 4B illustrate cross-sectional views of intermediate steps during a process for forming an integrated circuit die 50 in accordance with some embodiments. The integrated circuit die 50 will be packaged in subsequent processing to form an integrated circuit package. The integrated circuit die 50 may be a sensor die (e.g., an ultrasonic sensor), a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a micro-electro-mechanical-system (MEMS) die, a signal processing die (e.g., digital signal processing (DSP) die), a front-end die (e.g., analog front-end (AFE) dies), the like, or combinations thereof. As illustrated, in accordance with some embodiments, the integrated circuit die 50 is a sensor die, such as an ultrasonic sensor (e.g., an ultrasonic fingerprint sensor). In other embodiments, the integrated circuit die 50 may be a light sensor, an image sensor, or any suitable type of sensor as desired.

In FIG. 1, the integrated circuit die 50 includes a substrate 52. In some embodiments, the substrate 52 may be a wafer-level structure, such as a wafer, which may include different device regions that are singulated in subsequent steps to form a plurality of integrated circuit dies 50. In some embodiments, the substrate 52 comprises a semiconductor substrate 52A, such as silicon, doped or undoped, or an active layer of a semiconductor-on-insulator (SOI) substrate. The semiconductor substrate 52A may also include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52A has an active surface (e.g., the surface facing upwards in FIG. 1), sometimes called a front side, and an inactive surface (e.g., the surface facing downwards in FIG. 1), sometimes called a back side. The semiconductor substrate 52A may have a thickness of between about 130 µm and about 150 µm. The substrate 52 may have a thickness of between about 170 µm and about 190 µm.

In some embodiments, the substrate 52 further includes devices 52B formed in and/or on the active side of the semiconductor substrate 52A, and an interconnect structure 52C, including a plurality of metallization patterns (not shown), disposed over and electrically coupled to the devices 52B. The devices 52B may be active devices (e.g., transistors, diodes, etc.), passive device (e.g., capacitors, resistors, etc.), combinations thereof, or the like. The devices 52B may be formed using any methods suitable for forming devices. The interconnect structure 52C interconnects the devices 52B to form the integrated circuit. The metallization patterns of the interconnect structure 52C include metal lines and vias (not shown) formed in one or more low-k dielectric layers (not shown), and may be formed through any suitable process (such as deposition, damascene, dual damascene, or the like).

The interconnect structure 52C is electrically coupled to features disposed on or along an upper surface of the substrate 52. As illustrated, in embodiments in which the integrated circuit die 50 is a sensor such as an ultrasonic sensor, the integrated circuit die 50 may include sensing elements 54 and/or dummy elements 56 (e.g., dummy pads) on or along the upper surface of the substrate 52. Each sensing element 54 may be any suitable for generating, transmitting, and/or making, for example, a signal or pulse based on the type of sensor that is desired. For example, in an embodiment in which the sensor is an ultrasonic sensor, each sensing element 54 may include a piezoelectric transducer, responsive to ultrasonic forces, that is electrically coupled to the integrated circuit formed within the substrate 52.

The integrated circuit die 50 further includes pads 62, such as aluminum pads, such as input/output (I/O) regions to which external connections are made. The pads 62 are on the active side of the substrate 52 of the integrated circuit die 50, such as on an upper side of the interconnect structure 52C. The pads 62 may be separated from the sensing elements 54 and the dummy elements 56 by an isolation region 58 in order to reduce any unwanted electrical effect that the pads 62 may have on the sensing elements 54. One or more passivation films 64 are on the integrated circuit die 50, such as on portions of the pads 62, the sensing elements 54, and the dummy elements 56. As illustrated, openings extend through the passivation films 64 to the pads 62. The passivation films 64 may comprise silicon oxide, silicon nitride, silicon oxynitride, the like, or a combination thereof, and may be formed using atomic layer deposition (ALD), chemical vapor deposition (CVD), the like, or a combination thereof.

Figure 2:
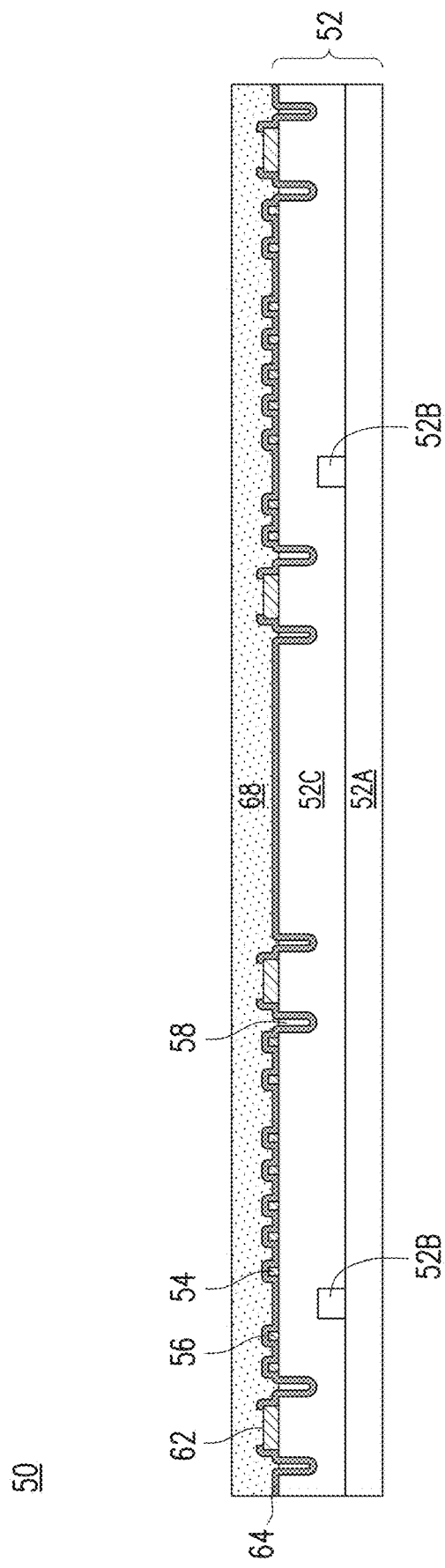

In FIG. 2, an insulating layer 68 may be formed over the structure of FIG. 1. The insulating layer 68 may be selected for stability, tensile strength, and flexibility in order to remain stable in subsequent processing steps, during storage or transportation, and/or when packaged into a semiconductor device. In some embodiments, a material of the insulating layer 68 is selected to have a high glass transition temperature $T_g$, a high decomposition temperature $T_d$ as well as a high tensile strength and a high Young's Modulus. As described below in greater detail, the insulating layer 68 is removed in subsequent processing steps. Accordingly, the insulating layer 68 may also be referred to as a sacrificial layer.

The insulating layer 68 may be a polymer such as a polyimide, a polybenzoxazole (PBO), benzocyclobutane (BCB), or the like; a nitride such as silicon nitride or the like; an oxide such as silicon oxide, phosphosilicate glass (PSG), borosilicate glass (BSG), borophosphosilicate glass (BPSG), or the like; the like, or a combination thereof. The insulating layer 68 may be formed, for example, by spin coating, lamination, ALD, CVD, or the like. For example, the insulating layer 68 may be formed by applying a polymer mixture to the structure, such as using a spin coating process. The polymer mixture may include a polymer base and a solvent.

In some embodiments, the polymer base includes a polyimide repeating unit. The polyimide repeating unit may further include an electron-attracting functional group FG capable of attracting a larger portion of the electron cloud in the molecule. As such, the electron-attracting functional group FG may draw electrons away from a portion of the repeating unit at or near the imide group. The electron-attracting functional group FG may be attached in series with the imide group as illustrated in the exemplary chemical structure below.

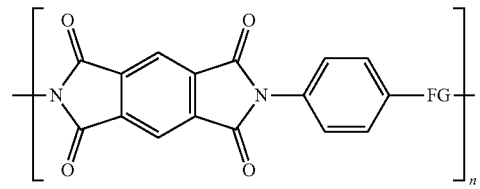

Exemplary chemical structures for the electron-attracting functional group FG may include strongly electronegative atoms (e.g., oxygen atoms), such as a carbonyl group including an ester group, as illustrated below. Variations of the chemical structure below may include carbon chains (including one or more carbons) in place of one or both of the oxygen atoms in each portion of the chain. Alternatively, the electron-attracting functional group FG may include anhydride, the like, or other suitable functional groups in series with the imide group.

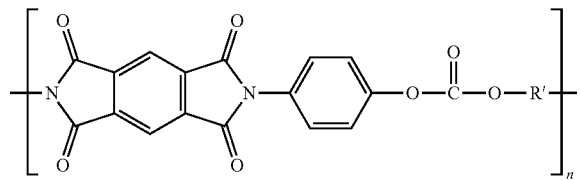

The solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

After applying the polymer mixture, a prebake process may be performed to evaporate some or all of the solvent. The prebake process may be performed at a temperature of between about 90° C. and about 100° C. and for a duration of between about 3 minutes and about 10 minutes. After the prebake process, a curing process to crosslink the polymer base may be performed at a temperature of between about 225° C. and about 230° C., and for a duration of between about 60 minutes and about 65 minutes. The insulating layer 68 may, for example, be formed to a thickness of between about 15 μm and about 30 μm.

The above-described polymer base and process for forming the insulating layer 68 achieves several advantages. First, due to having a glass transition temperature $T_g$ of between about 243° C. and about 255° C. and a decomposition temperature $T_d$ of between about 340° C. and about 370° C., the insulating layer 68 will remain stable at elevated processing temperatures that may be required in subsequent steps. Second, the insulating layer 68 is additionally reliable during subsequent processing due to having a tensile strength of between about 120 MPa and about 150 MPa, and a Young's Modulus of between about 3.0 GPa and about 4.5 GPa. Third, the insulating layer 68 may be efficiently removed in a subsequent processing step, such as by a wet etchant comprising a base, as described in greater detail below. In particular, the electron-attracting functional group facilitates a fast and high-yield reaction with other portions of the polymer structure, such as portions with a stronger positive charge near the imide group.

Figure 3:
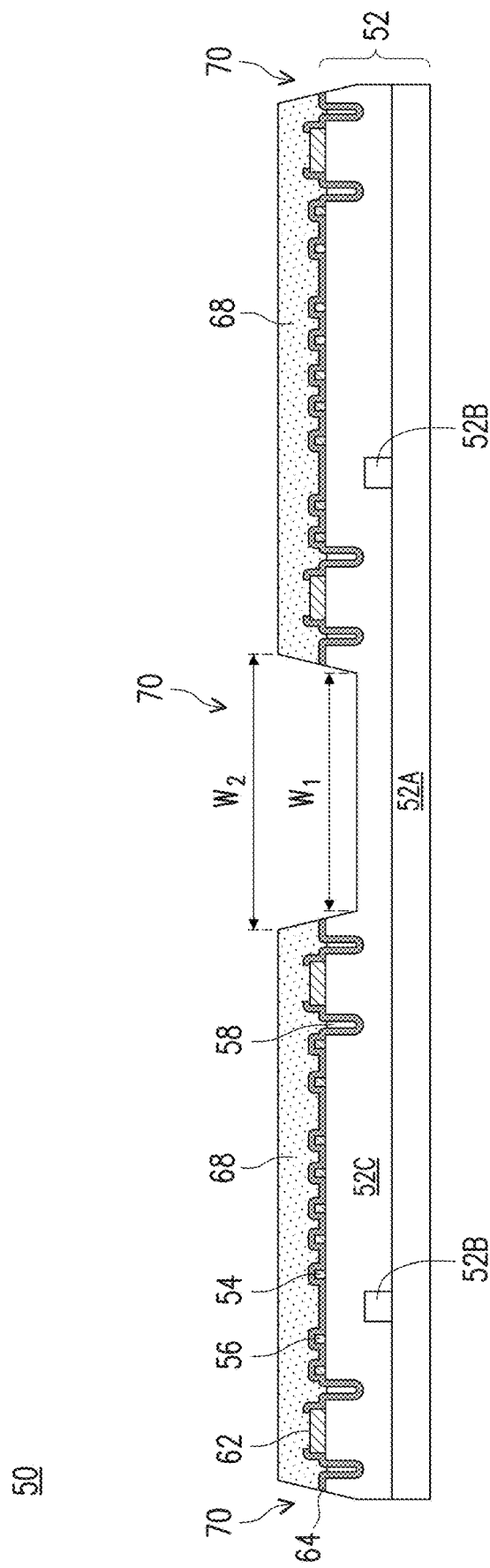

In FIG. 3, a grooving process, such as a laser grooving process may be performed to prepare each integrated circuit die 50 for singulation from the wafer. In an embodiment, the insulating layer 68, the passivation films 64, and portions of the substrate 52 (such as, for example, portions of dielectric layers of the interconnect structure 52C of the substrate 52) may be patterned using, for example, a laser grooving or laser drilling method, by which a laser is directed towards those portions of the insulating layer 68 which are desired to be removed in order to expose the underlying substrate 52. A benefit of the insulating layer 68 includes maintaining strong adhesion to the substrate 52 and the passivation films 64 during the grooving process. For example, the polyimide (e.g., cyclic imide) portions of the molecules of the insulating layer 68 may form multiple hydrogen bonds with the passivation films 64 to provide strong adhesion between the layers.

During the laser grooving process, the drill energy may be in a range of between about 500 mJ and about 1000 mJ, and a drill angle may be in a range of between about 0 degrees (perpendicular to a major surface of the insulating layer 68) and about 90 degrees to the normal of the major surface (i.e., an upper surface) of the insulating layer 68. The grooving process may be performed to form openings 70 over the substrate 52 to indicate scribe regions of the substrate 52 to be sliced during a subsequent singulation. In some embodiments, the openings 70 extend into the substrate 52, such as into the interconnect structure 52C of the substrate 52. In other embodiments, the openings 70 may extend through the interconnect structure 52C of the substrate 52 and into the semiconductor substrate 52A of the substrate 52.

In some embodiments, the openings 70 have widths that decrease as the openings 70 extend from an upper surface of the insulating layer 68 toward the substrate 52. The openings 70 may have a width $W_1$ at or near bottoms of the openings 70 of between about 50 μm and about 60 μm, and a width $W_2$ at or near the upper surface of the insulating layer 68 of between about 70 μm and about 100 μm. In some embodiments, the width $W_1$ may be about 65% of the width $W_2$. In some embodiments, sidewalls of the insulating layer 68, the passivation films 64, and the substrate 52 that are exposed by the openings 70 have non-vertical slopes, which form non-zero angles with the normal of the major surface (i.e., an upper surface) of the substrate 52. The angle of the non-vertical slopes may be substantially the same as the drill angle used in the laser grooving process. In the illustrated embodiment, bottom surfaces of the openings 70 are planar surfaces. In other embodiments, the bottom surfaces of the openings 70 may be curved surfaces having one or more convex portions, one or more concave portions, or a combination thereof.

Figure 4A:
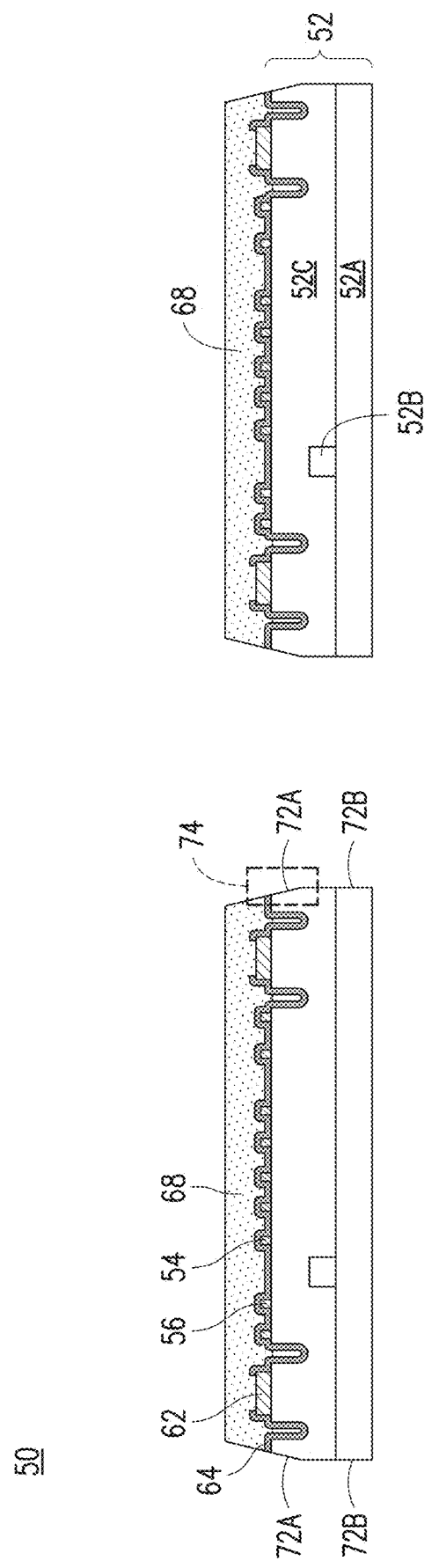

In FIG. 4A, the integrated circuit dies 50 are singulated from the wafer. In an embodiment, the singulation process may be performed by using a saw blade (not separately illustrated) to slice through the scribe regions of the substrate 52 between adjacent portions of the insulating layer 68 and at the openings 70 (see FIG. 3). However, as one of ordinary skill in the art will recognize, utilizing a saw blade for the singulation process is merely one illustrative embodiment and is not intended to be limiting. Any method for performing the singulation process, such as utilizing one or more etches, may be utilized. These methods and any other suitable methods may be utilized to singulate the structure. In some embodiments, the integrated circuit dies 50 have a width between about 198 mm and about 202 mm.

In some embodiments, sidewalls of the substrate 52 of the integrated circuit die 50 have faceted structures comprising first facets 72A and second facets 72B. The first facets 72A are formed during the laser grooving process described above with reference to FIG. 3. The first facets 72A have non-vertical slopes that form non-zero angles with the normal of the major surface (i.e., the upper surface) of the substrate 52. The second facets 72B are formed during the singulation process described above. In some embodiments where the singulation process comprises a sawing process, the second facets 72B have substantially vertical slopes that form substantially zero angles with the normal of the major surface (i.e., the upper surface) of the substrate 52 within process variations of the sawing process. In some embodiments, the facets 72A are formed in the interconnect structure 52C of the substrate 52 and not in the semiconductor substrate 52A of the substrate 52. In other embodiments, the facets 72A may be formed in both the interconnect structure 52C and the semiconductor substrate 52A of the substrate 52.

Figure 4B:
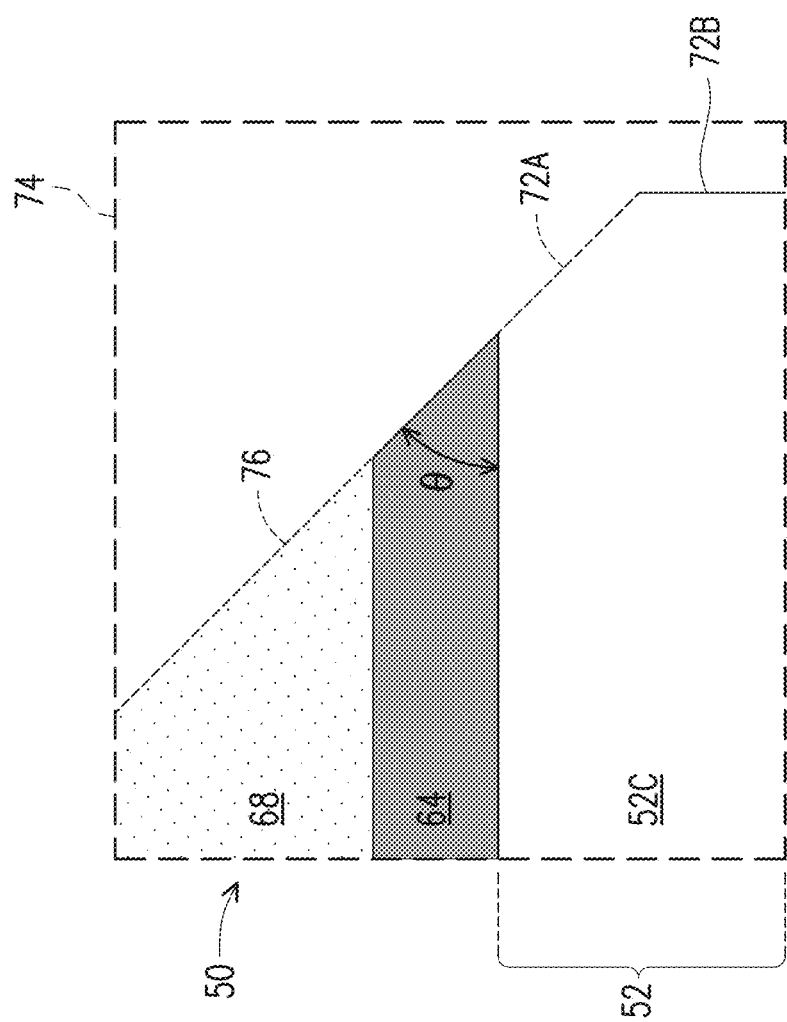

FIG. 4B illustrates a magnified cross-sectional view of a region 74 of the integrated circuit die 50 (see FIG. 4A) in accordance with some embodiments. In some embodiments, the facet 72A of the substrate 52, a sidewall of the passivation films 64, and a sidewall of the insulating layer 68 are substantially coplanar within process variations of the laser grooving process described above with reference to FIG. 3. In some embodiments, an imaginary plane 76 (denoted by a dashed line in FIG. 4B) extending along the facet 72A forms an angle θ with the major surface (i.e., the upper surface) of the substrate 52. In some embodiments, the angle θ is between about 50° and about 70°. As described below in greater detail, the insulating layer 68 is removed in subsequent processing steps. By forming the integrated circuit die 50 having faceted sidewalls with the angle θ in the range as described above, a volume of the insulating layer 68 is reduced. By reducing the volume of the insulating layer 68, a removal rate of the insulating layer 68 is increased in the subsequent removal process.

FIGS. 5, 6, 7, 8, 9, 10, 11A, 12, 13, 14, 15, 16, 17A, and 17B illustrate cross-sectional views of intermediate steps during a process for forming a first package component 100 in accordance with some embodiments. A first package region 100A and a second package region 100B are illustrated and one or more of the integrated circuit dies 50 are packaged to form an integrated circuit package in each of the package regions 100A and 100B. The integrated circuit packages may also be referred to as integrated fan-out (InFO) packages.

In FIG. 5, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be later removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 6:
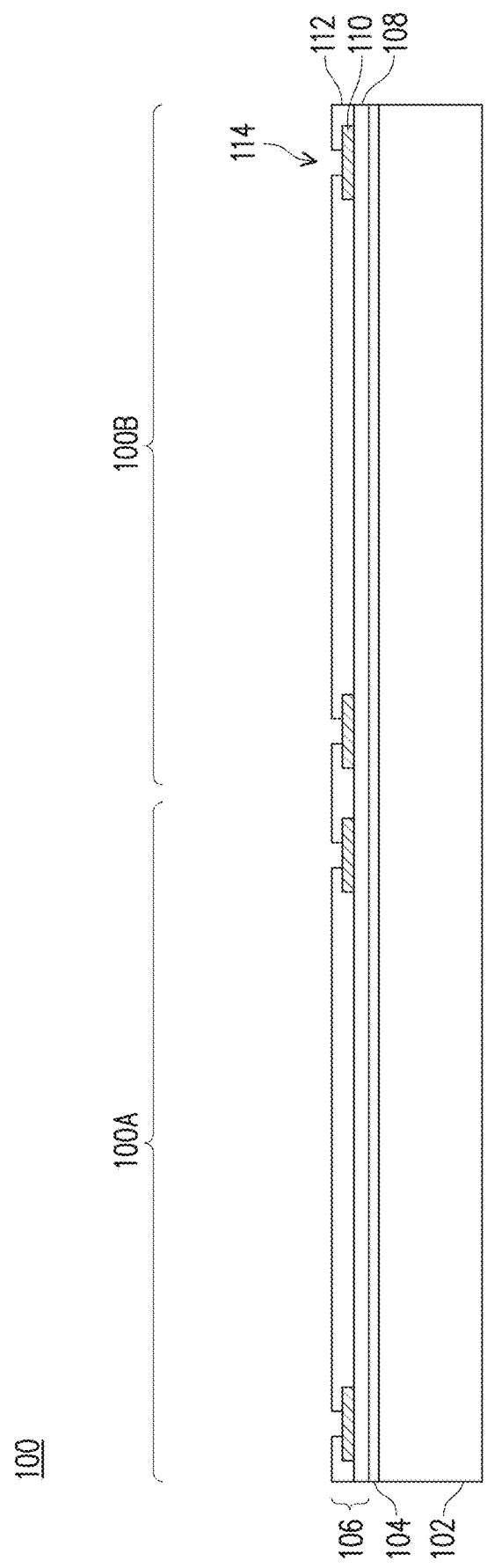

In FIG. 6, a redistribution structure 106 may be formed on the release layer 104. The redistribution structure 106 may also be referred to as a back-side redistribution structure. In the embodiment shown, the redistribution structure 106 includes an insulating layer 108, a metallization pattern 110 (sometimes referred to as a redistribution layer or a redistribution line) over the insulating layer 108, and an insulating layer 112 over the metallization pattern 110 and the insulating layer 108. The redistribution structure 106 is optional and may be omitted in some embodiments. In some embodiments, an insulating layer without metallization patterns is formed on the release layer 104 in lieu of the redistribution structure 106.

The insulating layer 108 may be formed on the release layer 104. The bottom surface of the insulating layer 108 may be in contact with an upper surface of the release layer 104. In some embodiments, the insulating layer 108 is formed of a polymer, such as polybenzoxazole (PBO), polyimide, benzocyclobutene (BCB), or the like. In other embodiments, the insulating layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The insulating layer 108 may be formed by any acceptable deposition process, such as spin coating, ALD, CVD, laminating, the like, or a combination thereof.

The metallization pattern 110 may be formed on the insulating layer 108. As an example to form metallization pattern 110, a seed layer (not specifically illustrated) is formed over the insulating layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not specifically illustrated) is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The insulating layer 112 may be formed on the metallization pattern 110 and the insulating layer 108. In some embodiments, the insulating layer 112 may be formed using similar materials and methods as the insulating layer 108 and the description is not repeated herein. In some embodiments, the insulating layer 108 and the insulating layer 112 comprise a same material. In other embodiments, the insulating layer 108 and the insulating layer 112 comprise different materials. The insulating layer 112 is then patterned to form openings 114 exposing portions of the metallization pattern 110. The patterning may be formed by an acceptable process, such as by exposing the insulating layer 112 to light when the insulating layer 112 is a photo-sensitive material, or by etching using, for example, an anisotropic etch when the insulating layer 112 is a non-photo-sensitive material. If the insulating layer 112 is a photo-sensitive material, the insulating layer 112 can be developed after the exposure.

FIG. 6 illustrates the redistribution structure 106 having a single metallization pattern 110 for illustrative purposes. In some embodiments, the redistribution structure 106 may include any number of insulating layers and metallization patterns. If more insulating layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying insulating layer and in openings of the underlying insulating layer, thereby interconnecting and electrically coupling various conductive lines.

Figure 7:
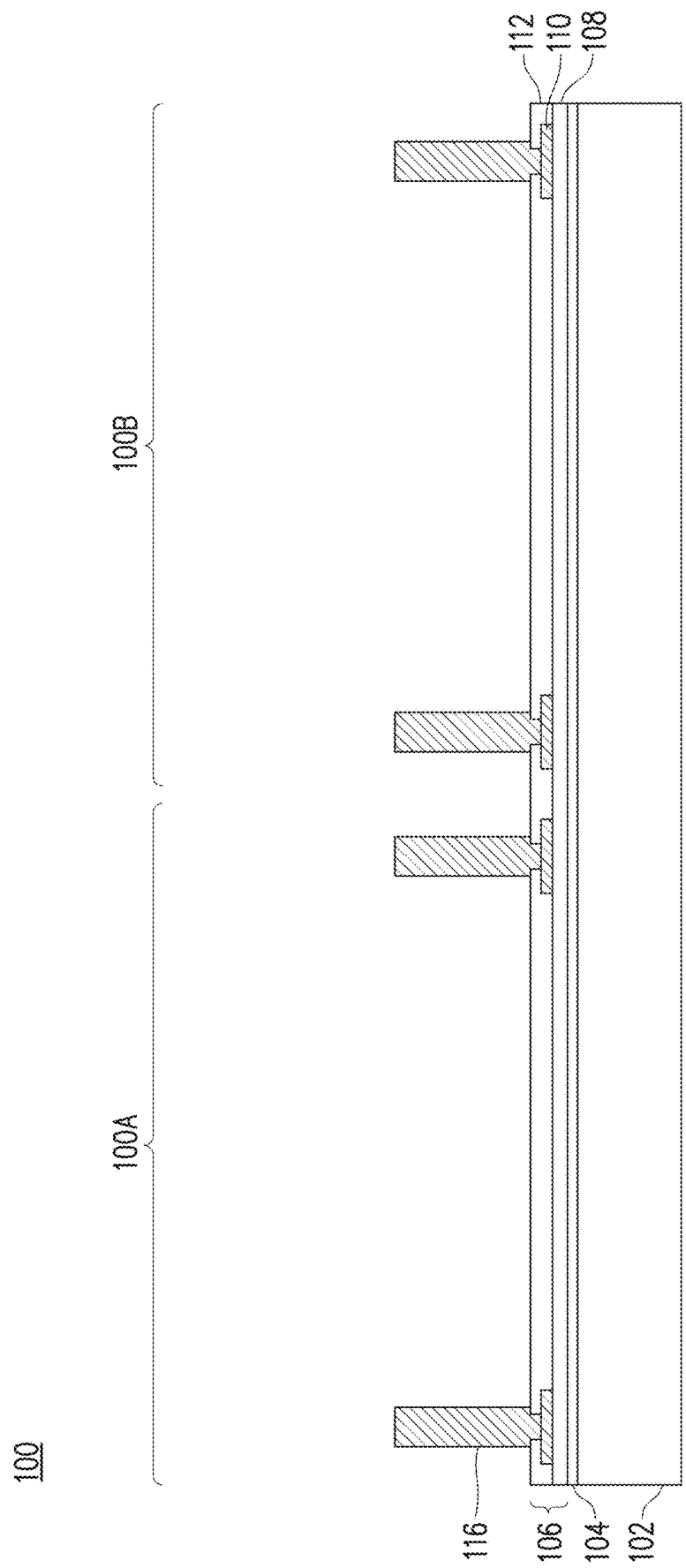

In FIG. 7, through vias 116 are formed in the openings 114 (see FIG. 6) and extending away from the topmost insulating layer (e.g., the insulating layer 112) of the redistribution structure 106. As an example to form the through vias 116, a seed layer (not specifically illustrated) is formed over the redistribution structure 106, for example, on the insulating layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist (not specifically illustrated) is formed and patterned on the seed layer. The photoresist may be formed by spin coating or the like and may be exposed to light for patterning. The pattern of the photoresist corresponds to the layout of the through vias 116. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and the conductive material form the through vias 116. Each of the through vias 116 may have a height of between about 245 µm and about 255 µm, and a width of between about 270 µm and about 290 µm.

Figure 8:
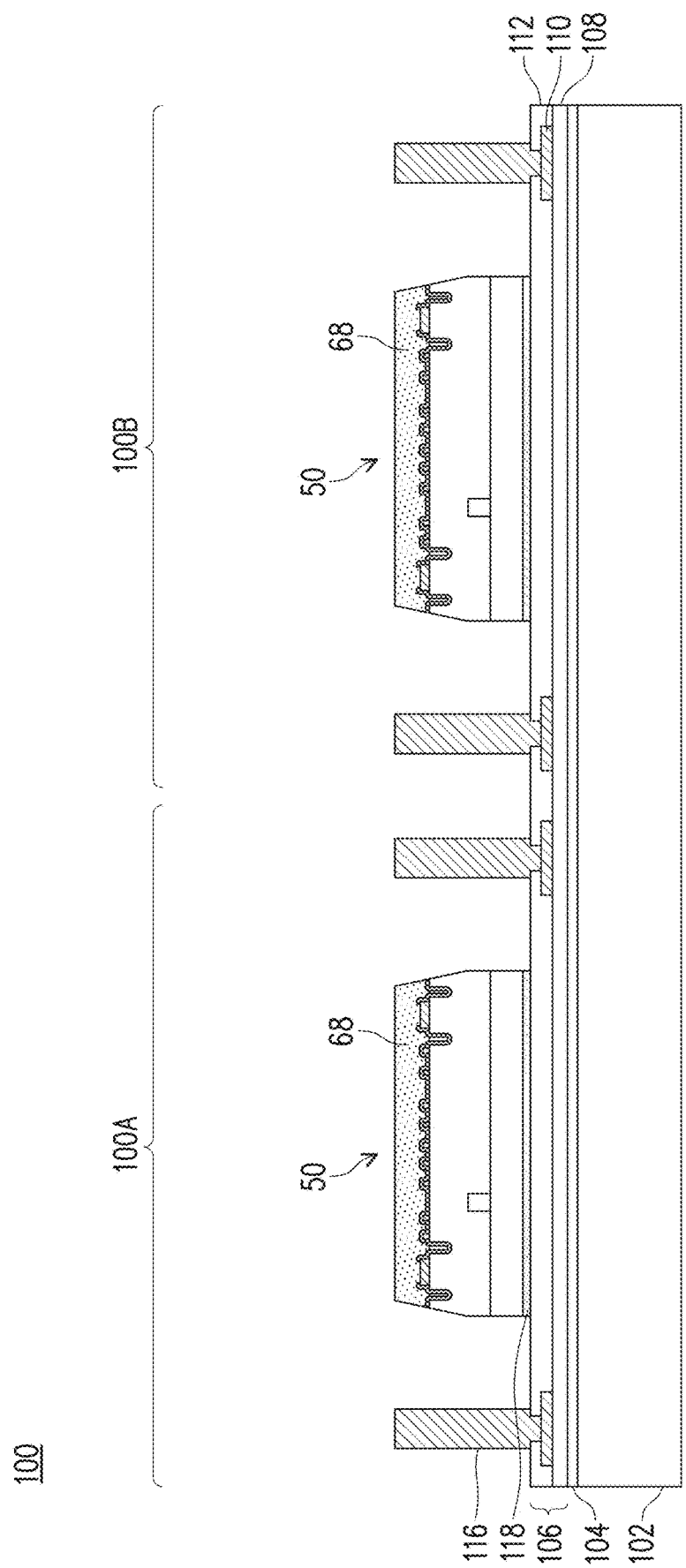

In FIG. 8, the integrated circuit dies 50 (FIG. 4A) are adhered to the insulating layer 112 by an adhesive 118. In the illustrated embodiments, a single integrated circuit die 50 is adhered in each of the package regions 100A and 100B. In other embodiments, the multiple integrated circuit dies 50 may be adhered adjacent one another in each of the package regions 100A and 100B. The adhesive 118 is on back-sides of the integrated circuit dies 50 and adheres the integrated circuit dies 50 to the redistribution structure 106, such as to the insulating layer 112. The adhesive 118 may be any suitable adhesive, epoxy, die attach film (DAF), or the like. The adhesive 118 may be applied to the back-sides of the integrated circuit dies 50, may be applied over the surface of the carrier substrate 102 if no redistribution structure 106 is utilized, or may be applied to an upper surface of the redistribution structure 106, if applicable. For example, the adhesive 118 may be applied to the back-sides of the integrated circuit dies 50 before singulating discussed above with reference to FIG. 4A to separate the integrated circuit dies 50.

Figure 9:
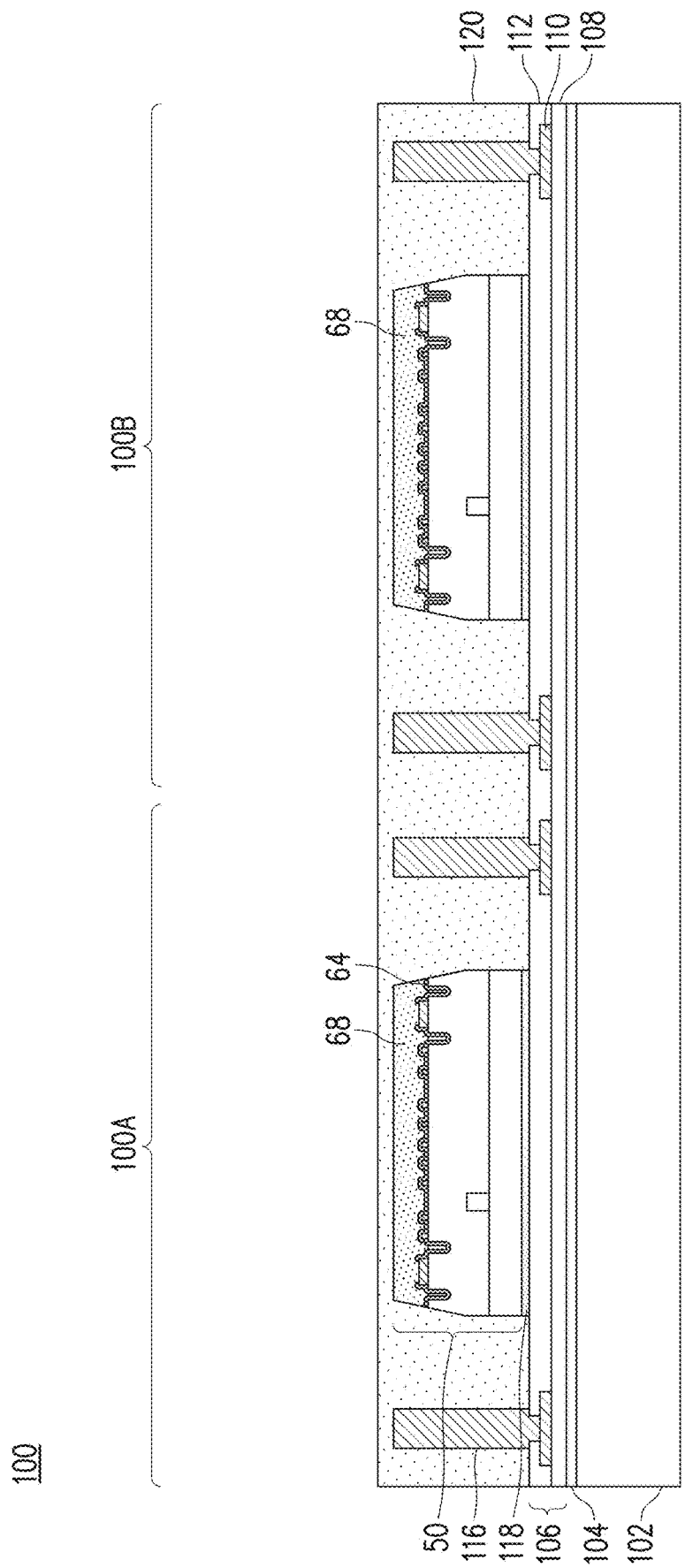

In FIG. 9, an encapsulant 120 is formed on and around the various components. After formation, the encapsulant 120 encapsulates the through vias 116 and the integrated circuit dies 50. The encapsulant 120 may be a molding compound, such as an epoxy, a resin, a moldable polymer, a combination thereof, or the like, with fillers dispersed therein. The fillers may include insulating fibers, insulating particles (e.g., silica particles, glass particles, micrite particles, or the like), other suitable elements, a combination thereof, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50 and follows the contours of the sidewalls of the insulating layer 68. The encapsulant 120 may be applied in liquid or semi-liquid form and then subsequently cured. Several advantages or benefits may be achieved by choosing the insulating layer 68 to be the polyimide polymer comprising an ester group and formed as described above with reference to FIG. 2. For example, the molding process for forming the encapsulant 120 may be performed without deforming the insulating layer 68. Accordingly, deformation of and damage to the integrated circuit die 50 are avoided.

Figure 10:
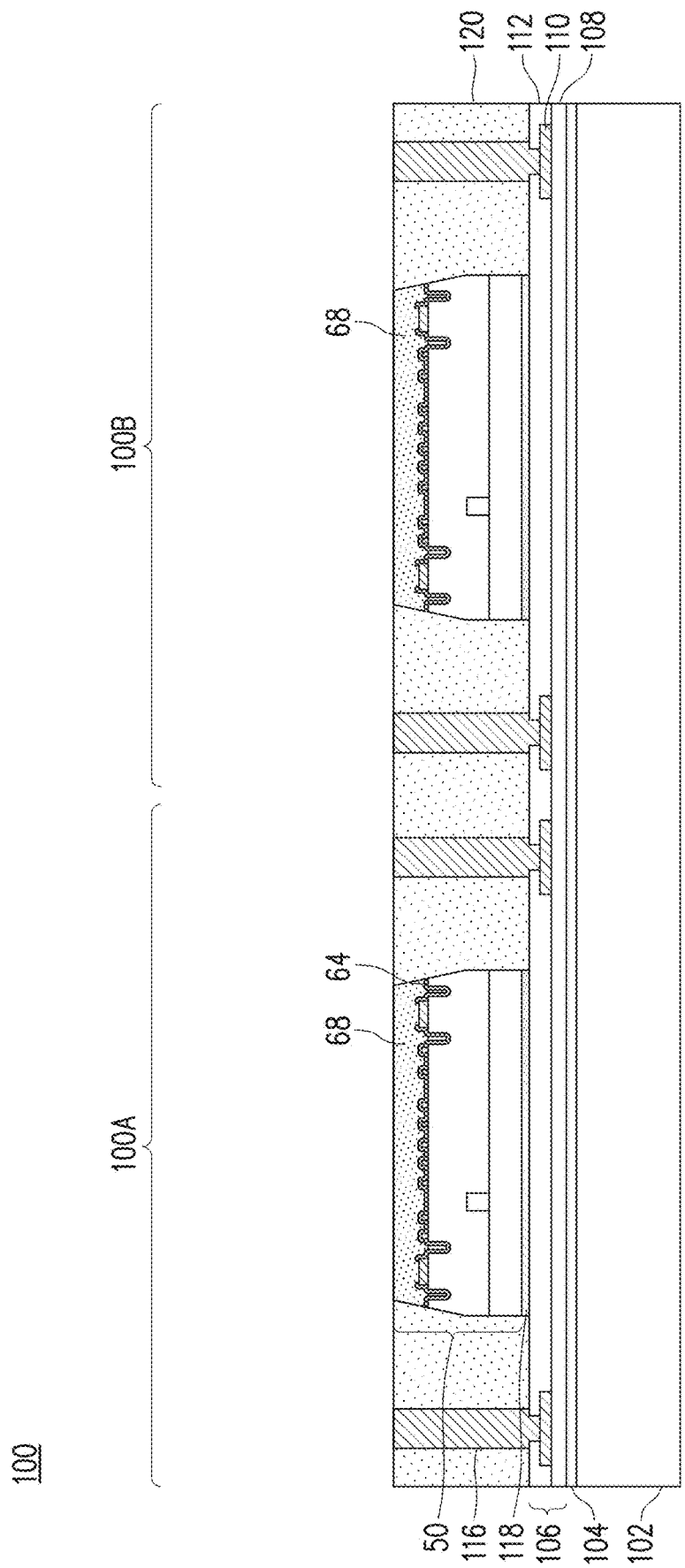

In FIG. 10, a planarization process is performed on the encapsulant 120 to expose the through vias 116 and the integrated circuit dies 50 (e.g., the insulating layer 68). The planarization process may also remove material of the through vias 116 and the insulating layer 68 until all of the through vias 116 and the insulating layer 68 are exposed. Top surfaces of the through vias 116, the insulating layer 68, and the encapsulant 120 are substantially coplanar after the planarization process within process variations. The planarization process may be, for example, a chemical-mechanical polish (CMP), a grinding process, or the like. In some embodiments, the planarization process may be omitted, for example, if the through vias 116 and/or the insulating layer 68 are already exposed. Several advantages or benefits may be achieved by choosing the insulating layer 68 to be the polyimide polymer comprising the ester group and formed as described above with reference to FIG. 2. For example, benefits of the insulating layer 68 include having a desired hardness and maintaining strong adhesion to the substrate 52 and the passivation film 64 during the planarization process to avoid damage to the insulating layer 68 and avoid delamination of the insulating layer 68 from the passivation film 64. Accordingly, damage to the integrated circuit die 50 is avoided.

Figure 11A:
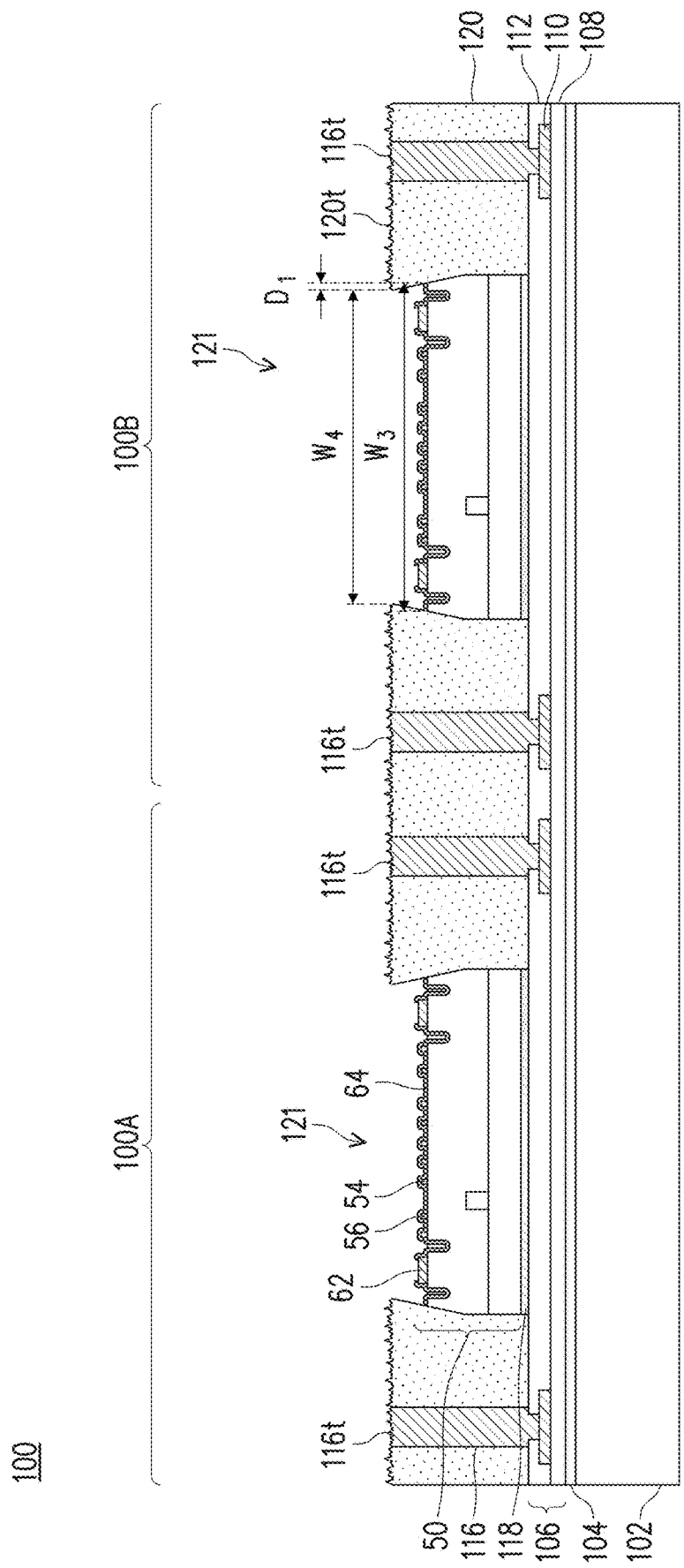

In FIG. 11A, the insulating layer 68 (see FIG. 10) is removed from each of the integrated circuit dies 50 to form openings 121 exposing the pads 62 and the passivation films 64. The insulating layer 68 may be removed, for example, with an isotropic etch or an anisotropic etch using a wet or a dry etchant. As illustrated, following the removal of the insulating layer 68, the encapsulant 120 may substantially retain its shape including overhanging the integrated circuit dies 50 due to the sloped sidewalls of the insulating layer 68. The opening 121 may have a width $W_3$ proximate to the substrate 52 of between about 30.5 mm and about 30.7 mm, and a width $W_4$ at or near the upper surface of the encapsulant 120 of between about 30.49 mm and about 30.5 mm. In some embodiments, the width $W_4$ may be between about 0.7% and about 0.13% less than (or about 99.93% and about 99.87%, respectively, of) the width $W_3$. As a result, the encapsulant 120 may overhang the opening 121 by a distance $D_1$ of between about 10 µm and about 20 µm.

In accordance with embodiments using a wet etching process, the wet etchant comprises a stripper, such as SPR920 or the like. In some embodiments, SPR920 is a solution comprising a base, such as tetramethylammonium hydroxide (TMAH), dimethyl sulfoxide (DMSO), and water, where the TMAH has a concentration by weight of between about 1% and about 2%, the DMSO has a concentration by weight of between about 96% and about 98%, and the water has a concentration by weight of between about 1% and about 2%. The wet etching process may be performed at a temperature of between about 48° C. and about 52° C., and for a duration of between about 3 minutes and about 10 minutes.

Figure 11B:
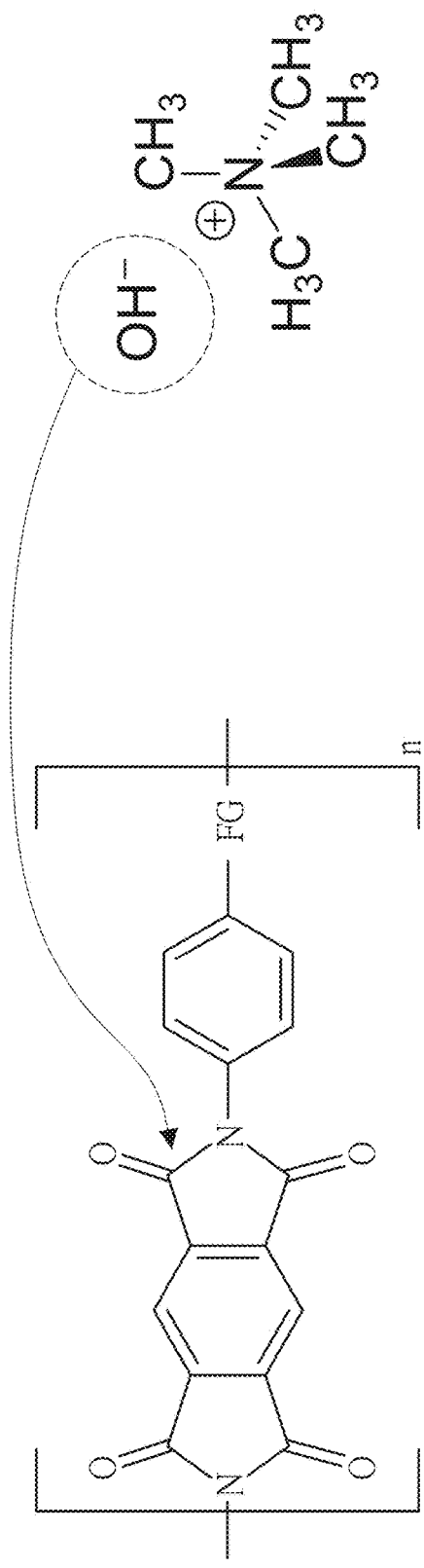
FIGS. 11B and 11C illustrate possible chemistry mechanisms for an intermediate step during a process for forming a package component in accordance with some embodiments.
Figure 11C:
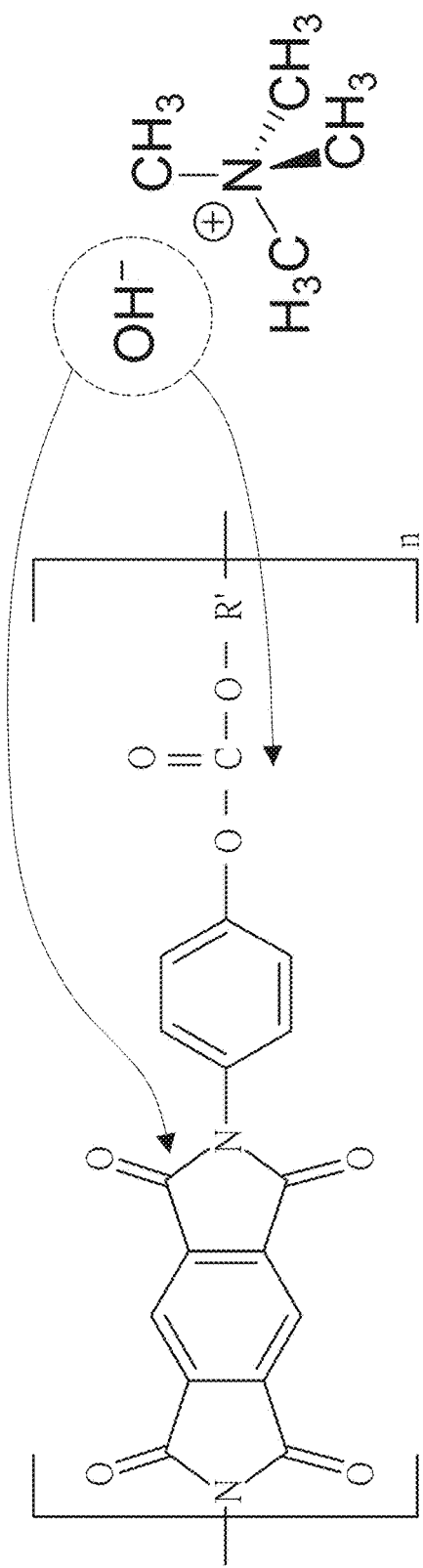

FIG. 11B illustrates a possible generic mechanism and FIG. 11C illustrates a possible specific mechanism for how the main component of the wet etchant (e.g., TMAH in SPR920) may interact with and remove the insulating layer 68. The main component of the wet etchant (e.g., the negatively charged portions of the base, such as the hydroxyl groups in TMAH) may attract positively charged regions of the insulating layer 68. The electron-attracting functional group FG draws electrons of the molecules of the insulating layer 68 away from other portions of the molecules. For example, the carbon atoms in the cyclic imide group may have a slight positive charge due to electrons being attracted to the electron-attracting functional group FG. As such, the TMAH may break apart the molecules of the insulating layer 68 to be removed in the wet etching process.

Referring to FIG. 11C in which the molecules of the insulating layer 68 may comprise an ester group as the electron-attracting functional group FG, additional sites of the molecule may attract the wet etchant. For example, in addition to the carbon atoms of the cyclic imide group, the carbon atom in the ester group may also have a slight positive charge due to electrons being attracted to the oxygen atoms of the ester group. As such, the molecules of the insulating layer 68 comprising a polyimide with ester chemical structure may provide additional sites for the negatively charged portions of the base (e.g., TMAH) to efficiently break up the insulating layer 68.

Alternatively, in embodiments using a dry etching process, the dry etchant may comprise oxygen ($O_2$), nitrogen ($N_2$), the like, or any combinations thereof. The dry etching process may be performed at a temperature of between about 23° C. and about 26° C., at a pressure of between about 45 Pa and about 55 Pa, and for a duration of between about 24 minutes and about 30 minutes.

An advantage of choosing the insulating layer 68 to be the polyimide polymer comprising the ester group and formed as described above with reference to FIG. 2 is to achieve improved efficiency and yield in the isotropic wet etching process described above using, for example, SPR920 comprising TMAH. As a result, the wet etching process may process more than about 9 wafers per hour, such as up to about 167 wafers per hour, as compared to the above described dry etching process, which may process about 9 wafers per hour. In addition, the wet etching process may be about three or four times less expensive than the dry etching process.

Referring back to FIG. 11A, in some embodiments, the process for removing the insulating layer 68 (see FIG. 10) roughens the upper surface of the encapsulant 120 and forms a roughened upper surface 120t of the encapsulant 120. In some embodiments, a roughness of the upper surface of the encapsulant 120 after performing the wet etching process as described above is greater than a roughness of the upper surface of the encapsulant 120 after performing the dry etching process as described above. In embodiments using the wet etching process as described above, the roughened upper surface 120t of the encapsulant 120 has a roughness between about 0.5 µm and about 0.7 µm. In embodiments using the dry etching process as described above, the roughened upper surface 120t of the encapsulant 120 has a roughness between about 0.1 µm and about 0.2 µm.

In some embodiments, the process for removing the insulating layer 68 (see FIG. 10) further roughens the upper surfaces of the through vias 116 and forms roughened upper surfaces 116t of the through vias 116. In some embodiments, a roughness of the upper surfaces of the through vias 116 after performing the wet etching process as described above is greater than a roughness of the upper surfaces of the through vias 116 after performing the dry etching process as described above due to corrosion of a conductive material (such as, for example, copper) of the through vias 116 in the wet etching process. In embodiments using the wet etching process as described above, the roughened upper surfaces 116t of the through vias 116 have a roughness between about 0.02 µm and about 0.2 µm. In embodiments using the dry etching process as described above, the roughened upper surfaces 116t of the through vias 116 have a roughness between about 0.01 µm and about 0.05 µm.

In FIGS. 12, 13, 14, and 15, a redistribution structure 122 (see FIG. 15) is formed over the encapsulant 120, the through vias 116, and the integrated circuit dies 50. The redistribution structure 122 may also be referred to as a front-side redistribution structure. The redistribution structure 122 includes insulating layers 124 and 128, and metallization pattern 126. More insulating layers and metallization patterns may be formed in the redistribution structure 122. The metallization patterns may also be referred to as redistribution layers or redistribution lines. The redistribution structure 122 is shown as an example having one metallization pattern. If more insulating layers and metallization patterns are to be formed, steps and processes discussed below may be repeated.

Figure 12:
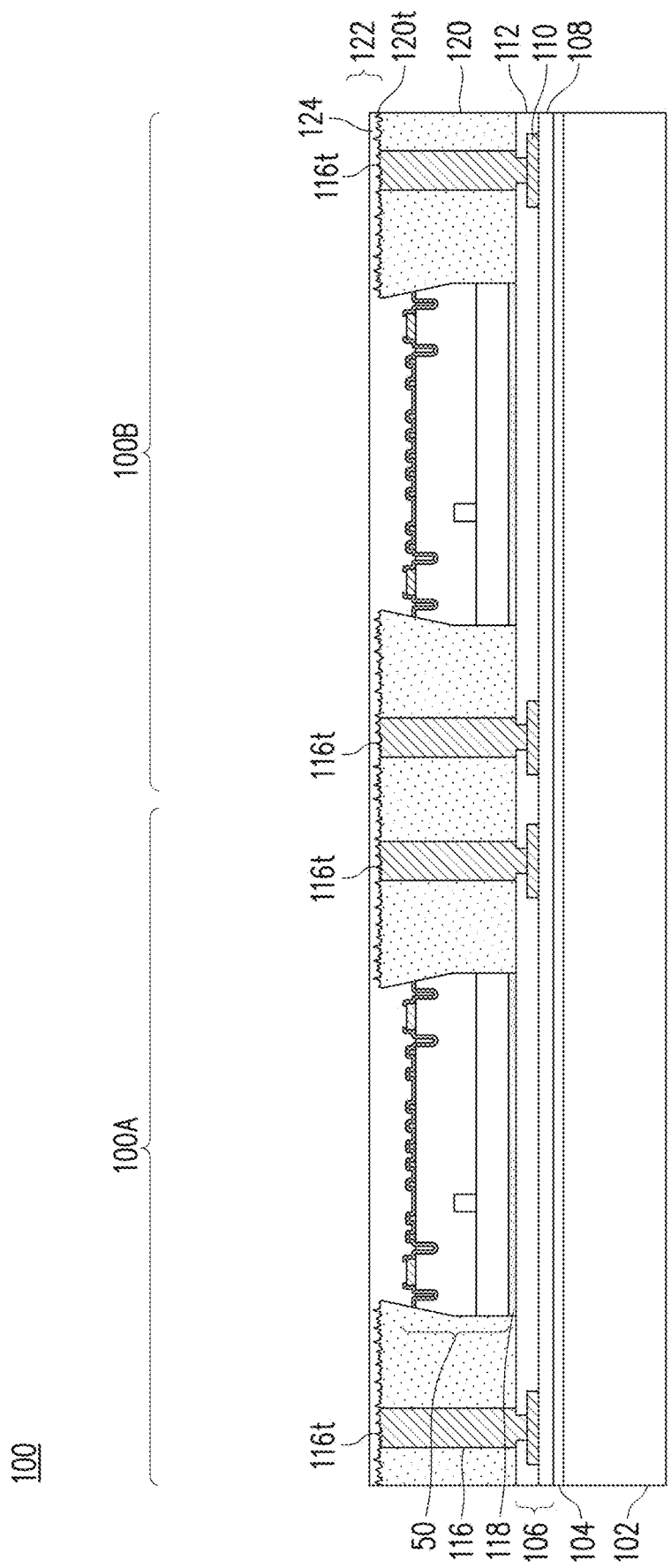

In FIG. 12, the insulating layer 124 is deposited on the encapsulant 120, the through vias 116, and into the openings 121 (see FIG. 11A) over the substrates 52 of the integrated circuit dies 50. As illustrated, the insulating layer 124 may substantially fill the openings 121. In some embodiments, the insulating layer 124 may be formed using similar materials and methods as the insulating layer 108 described above with reference to FIG. 6 and the description is not repeated herein. In some embodiments, a planarization process is performed to give the insulating layer 124 a substantially planar upper surface. In some embodiments, portions of the insulating layer 124 that are disposed directly over the integrated circuit dies 50 and below the upper surface of the encapsulant 120 have a substantially same profile as the insulating layer 68 illustrated in FIG. 10, since these portions of the insulating layer 124 fill openings 121 (FIG. 11A) that are formed after removing the insulating layer 68. The insulating layer 124 may have a thickness directly above the encapsulant 120 of between about 9 µm and about 11 µm.

In some embodiments, the roughened upper surface 120t of the encapsulant 120 improves adhesion between the encapsulant 120 and the insulating layer 124. In embodiments using the wet etching process as described above with reference to FIG. 11A, increased roughness of the roughened upper surface 120t of the encapsulant 120 increases adhesion between the encapsulant 120 and the insulating layer 124 compared to embodiments using the dry etching process as described above with reference to FIG. 11A.

In some embodiments, the roughened upper surfaces 116t of the through vias 116 improve adhesion between the through vias 116 and the insulating layer 124. In embodiments using the wet etching process as described above with reference to FIG. 11A, increased roughness of the roughened upper surfaces 116t of the through vias 116 increases adhesion between the through vias 116 and the insulating layer 124 compared to embodiments using the dry etching process as described above with reference to FIG. 11A.

Figure 13:
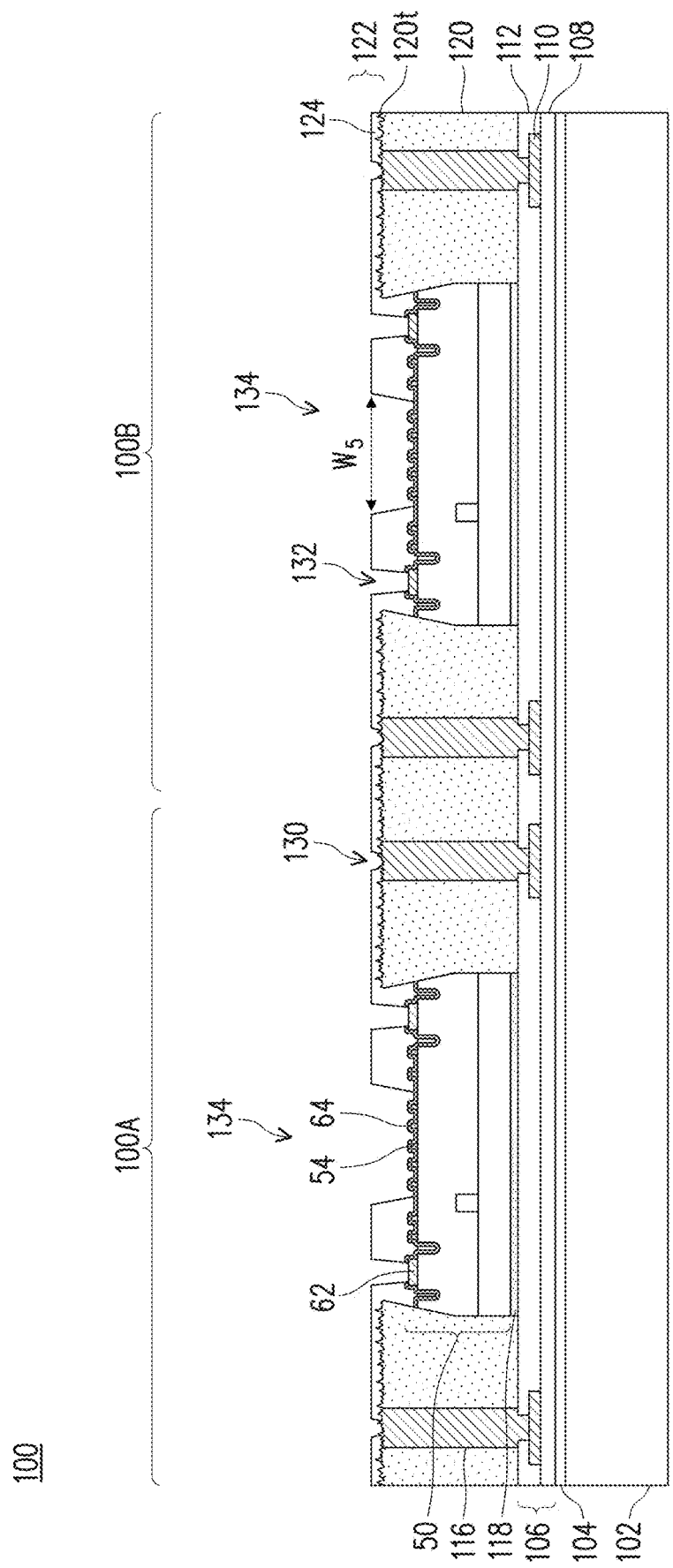

In FIG. 13, the insulating layer 124 is then patterned. The patterning forms openings 130 exposing portions of the through vias 116, openings 132 exposing portions of the pads 62, and openings 134 exposing the passivation film 64 directly over the sensing elements 54. The patterning may be performed by an acceptable process, such as by exposing and developing the insulating layer 124 when the insulating layer 124 is a photo-sensitive material. In other embodiments when the insulating layer 124 is a non-photo-sensitive material, a mask layer (not specifically illustrated) may be formed and patterned over the insulating layer 124, and exposed portions of the insulating layer 124 may be removed by, for example, etching. The opening 134 may have a width $W_5$ of between about 29.3 mm and about 29.4 mm.

Figure 14:
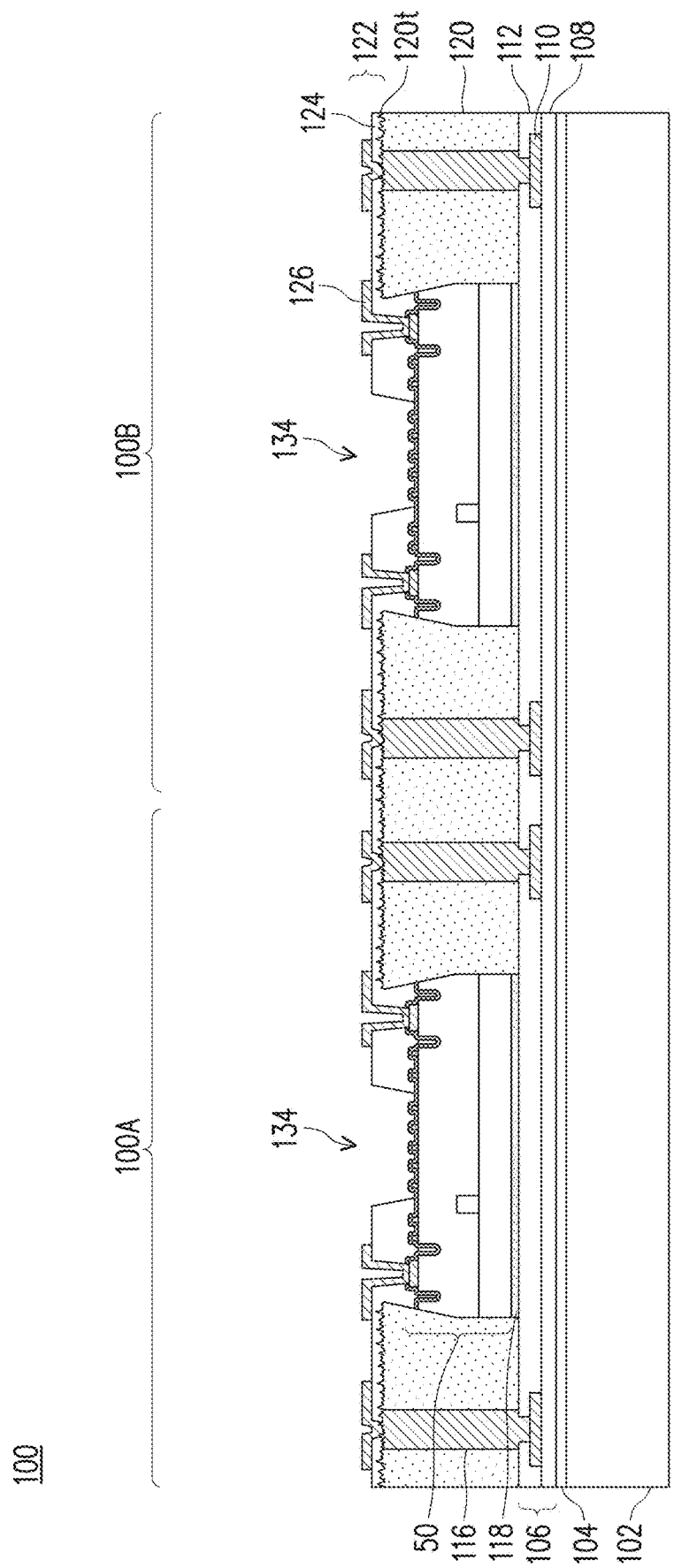

In FIG. 14, the metallization pattern 126 is then formed. The metallization pattern 126 includes conductive elements extending along the major surface of the insulating layer 124 and extending through the insulating layer 124 to physically and electrically couple to the through vias 116 and the pads 62 of the integrated circuit dies 50. As an example, to form the metallization pattern 126, a seed layer (not specifically illustrated) is formed over the insulating layer 124 and in the openings (e.g., the openings 130, the openings 132, and the openings 134 illustrated in FIG. 13) extending through the insulating layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist (not specifically illustrated) is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer (including portions of the seed layer within the openings 130 over the through vias 116 and the openings 132 over the pads 62). A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer (including portions of the photoresist and the seed layer within the openings 134 over the sensing elements 54) on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The metallization pattern may have a thickness of between about 4 μm and about 5 μm.

Figure 15:
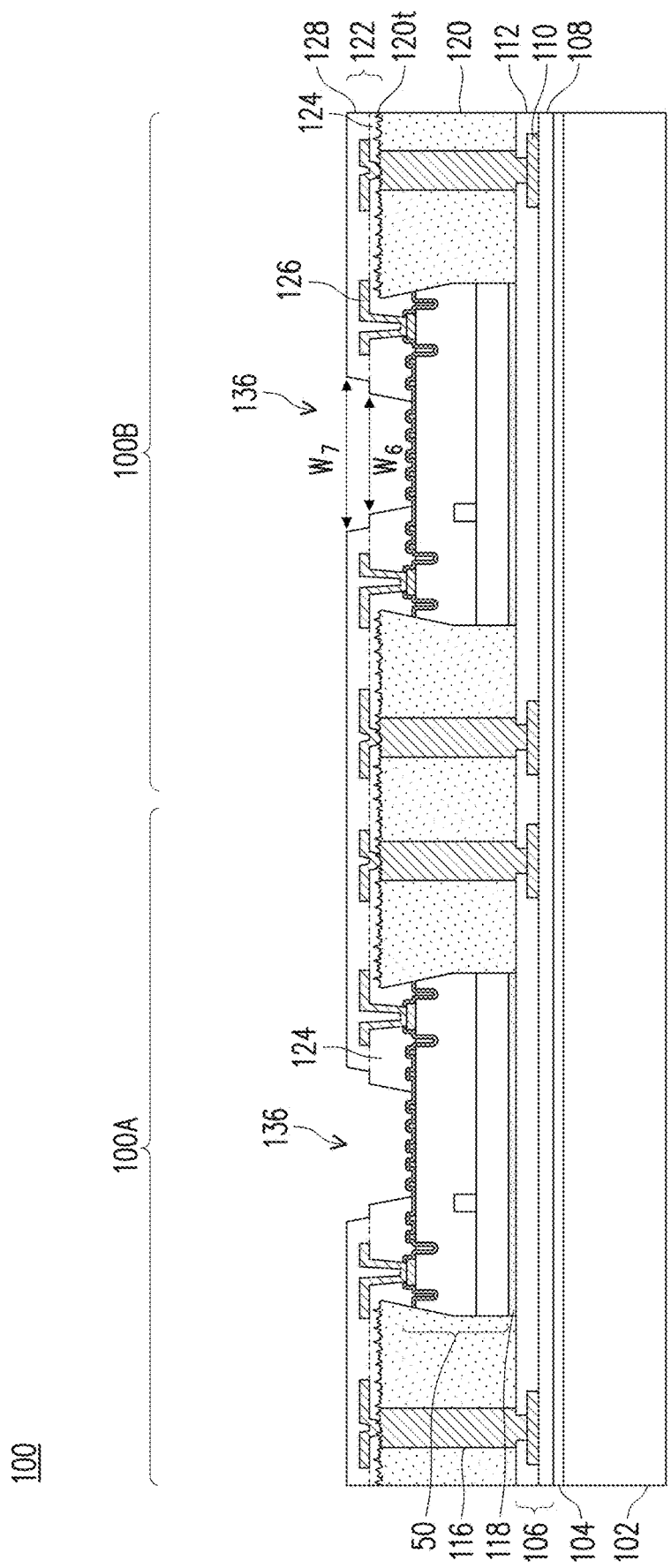

In FIG. 15, the insulating layer 128 is deposited on the metallization pattern 126 and the insulating layer 124. In some embodiments, the insulating layer 128 may be formed using similar materials and methods as the insulating layer 108 described above with reference to FIG. 6 and the description is not repeated herein. In some embodiments, the insulating layer 124 and the insulating layer 128 comprise a same material. In other embodiments, the insulating layer 124 and the insulating layer 128 comprise different materials. The insulating layer 128 may be patterned similarly to the insulating layer 124 to form openings 136. For example, the patterning may be performed by an acceptable process, such as by exposing and developing the insulating layer 128 to light when the insulating layer 128 is a photo-sensitive material or by etching using, for example, an anisotropic etch when the insulating layer 128 is a non-photo-sensitive material. The openings 136 have a width $W_6$ in the insulating layer 124 and a width $W_7$ in the insulating layer 128. In some embodiments, the width $W_6$ of the openings 136 may be substantially same as the width $W_5$ of the openings 134 (see FIG. 14), and the width $W_7$ of the openings 136 may be greater than the width $W_6$ of the openings 136. For example, the width $W_6$ may be between about 29.25 mm and about 29.35 mm, and the width $W_7$ may be between about 29.35 mm and about 29.39 mm. In other embodiments, the openings 134 may not be formed during the patterning of the insulating layer 124 as described above with reference to FIG. 13. In such embodiments, the openings 136 may be formed by simultaneously patterning the insulating layer 124 and the insulating layer 128. The insulating layer 128 may have a thickness directly above the encapsulant 120 of between about 8.5 μm and about 11 μm.

Although not specifically illustrated, in embodiments in which the integrated circuit dies 50 are desired to be connected through the insulating layer 128, under-bump metallizations (UBMs) may be formed for external connection to the redistribution structure 122, for example, for some integrated circuit dies 50 that are logic devices or memory devices. In some embodiments and as discussed below, the integrated circuit dies 50 that are logic devices or memory devices may have external connections through the metallization pattern 126, the through vias 116, and the redistribution structure 106. In some embodiments, the package regions (e.g., the first package region 100A and/or the second package region 100B) that include integrated circuit dies 50 that are sensor dies may remain free of the UBMs.

Figure 16:
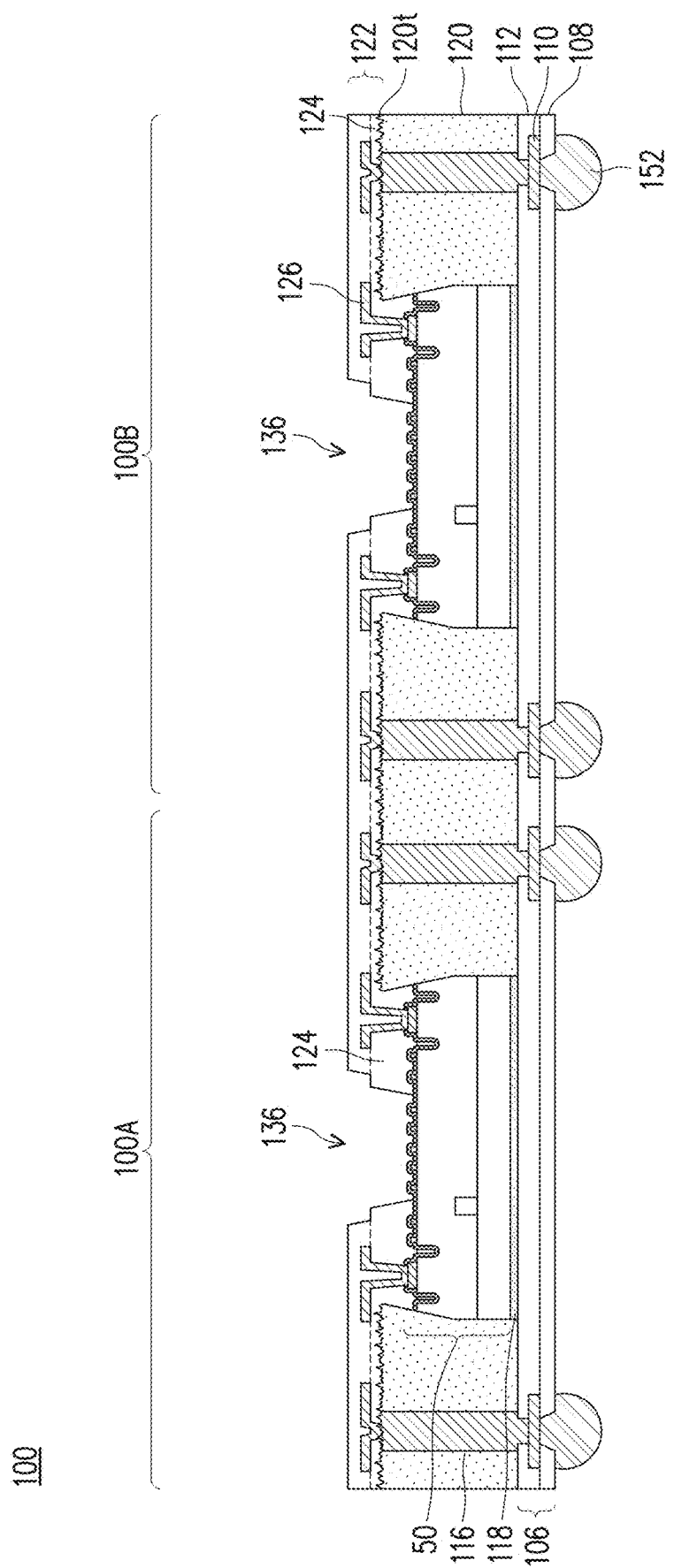

In FIG. 16, a carrier substrate de-bonding is performed to detach (or "de-bond") the carrier substrate 102 (see FIG. 15) from the redistribution structure 106 (e.g., the insulating layer 108). In some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown) to form additional structures, such as conductive connectors 152 described below.

Further in FIG. 16, conductive connectors 152 are formed extending through the insulating layer 108 to contact the metallization pattern 110. Openings are formed through the insulating layer 108 to expose portions of the metallization pattern 110. The openings may be formed, for example, using laser drilling, etching, or the like. The conductive connectors 152 are formed in the openings. In some embodiments, the conductive connectors 152 comprise flux and are formed in a flux dipping process. In some embodiments, the conductive connectors 152 comprise a conductive paste such as solder paste, silver paste, or the like, and are dispensed in a printing process. The conductive connectors 152 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 152 may include a conductive material such as solder, copper, aluminum, gold, nickel, silver, palladium, tin, the like, or a combination thereof. In some embodiments, the conductive connectors 152 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 152 comprise metal pillars (such as copper pillars) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 17A:
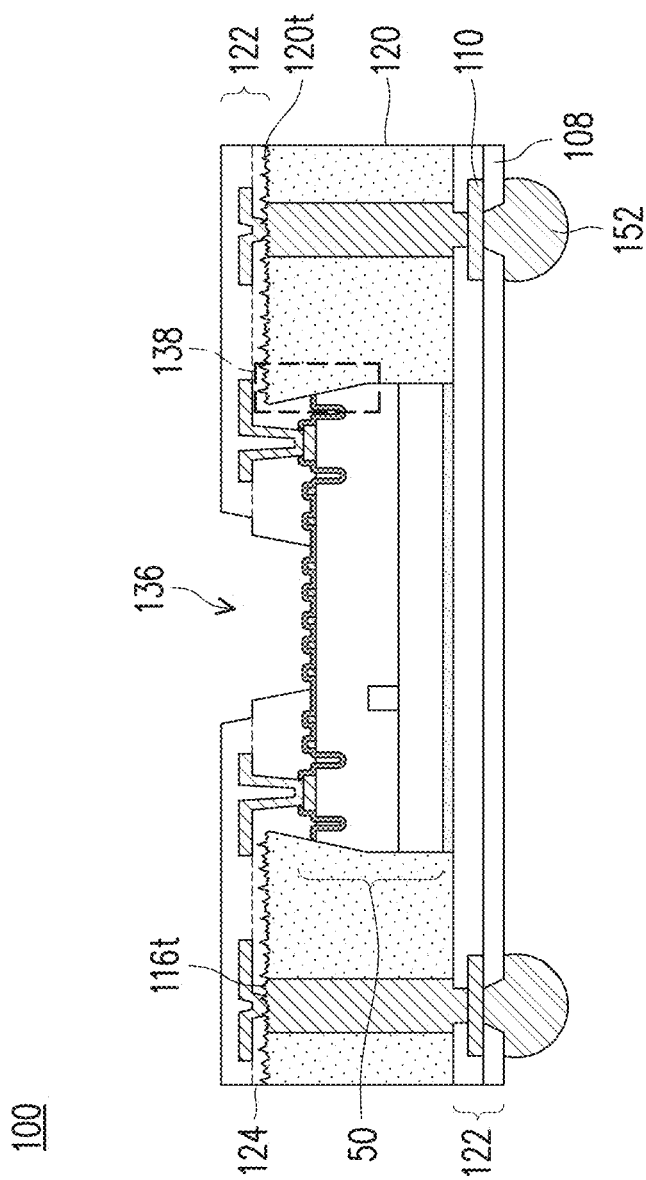

In FIG. 17A, a singulation process is performed by sawing along scribe regions (not specifically illustrated), for example, between the first package region 100A and the second package region 100B (see FIG. 16). The sawing singulates the first package region 100A from the second package region 100B to form individual first package components 100. The illustrated individual first package component 100 is either one of the first package region 100A or the second package region 100B.

In some embodiments, a first roughness of a first portion of the roughened upper surface 120t of the encapsulant 120 at a sloped sidewall of the encapsulant 120 in the interior of the first package component 100 is different from a second roughness of a second portion of the roughened upper surface 120t of the encapsulant 120 at an edge of the first package component 100. In some embodiments, the first roughness of the roughened upper surface 120t of the encapsulant 120 is greater than the second roughness of the roughened upper surface 120t of the encapsulant 120. A difference between the first roughness of the roughened upper surface 120t of the encapsulant 120 and the second roughness of the roughened upper surface 120t of the encapsulant 120 may also be referred to as uniformity of the roughened upper surface 120t of the encapsulant 120. In embodiments using the wet etching process as described above with reference to FIG. 11A, the roughened upper surface 120t of the encapsulant 120 has a uniformity of less than about 0.1 μm. In embodiments using the dry etching process as described above with reference to FIG. 11A, the roughened upper surface 120t of the encapsulant 120 has a uniformity of greater than about 0.5 μm.

Figure 17B:
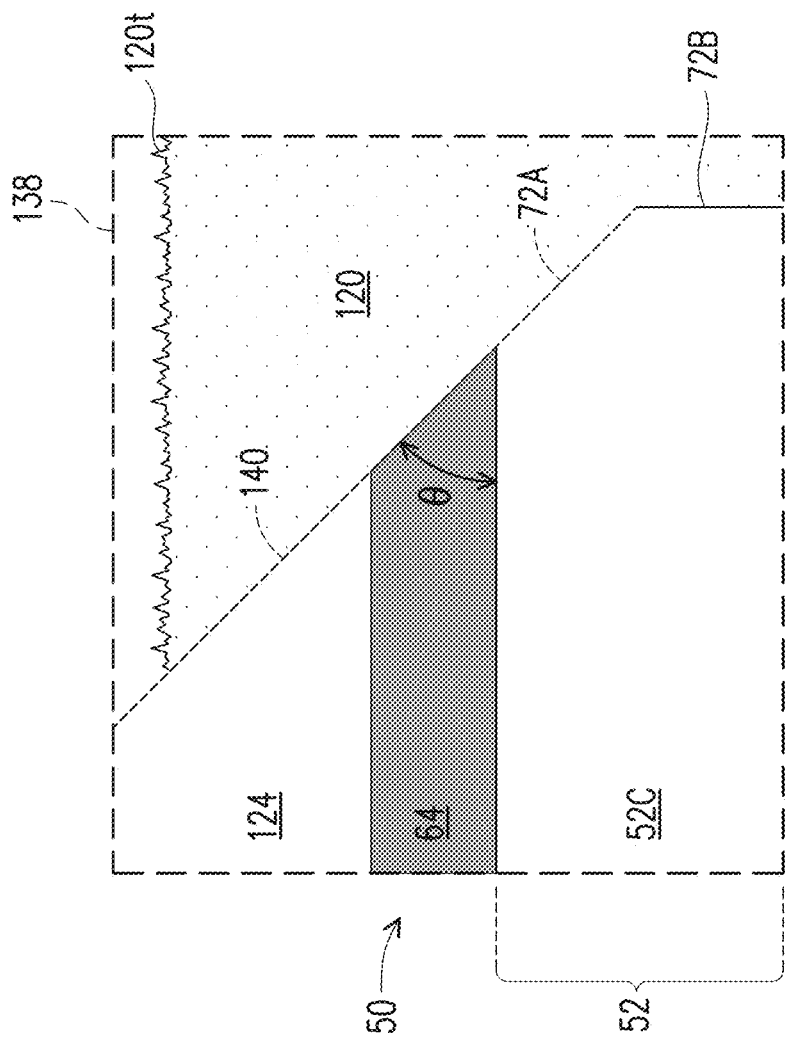

FIG. 17B illustrates a magnified cross-sectional view of a region 138 of the first package component 100 (see FIG. 17A) in accordance with some embodiments. In some embodiments, the facet 72A of the substrate 52, a sidewall of the passivation film 64, and a sidewall of the insulating layer 124 are substantially coplanar. In some embodiments, an imaginary plane 140 (denoted by a dashed line in FIG. 17B) extending along the facet 72A forms an angle θ with the major surface (such as the upper surface) of the substrate 52. In some embodiments, the angle θ is between about 50° and about 70°. In some embodiments, an interface between the encapsulant 120 and the integrated circuit die 50 comprises a first portion (such as an interface between the encapsulant 120 and the facet 72A) having a first slope and a second portion (such as an interface between the encapsulant 120 and the facet 72B) having a second slope different from the first slope. The first slope is same as a slope of the facet 72A. The second slope is same as a slope of the facet 72B.

Figure 18:
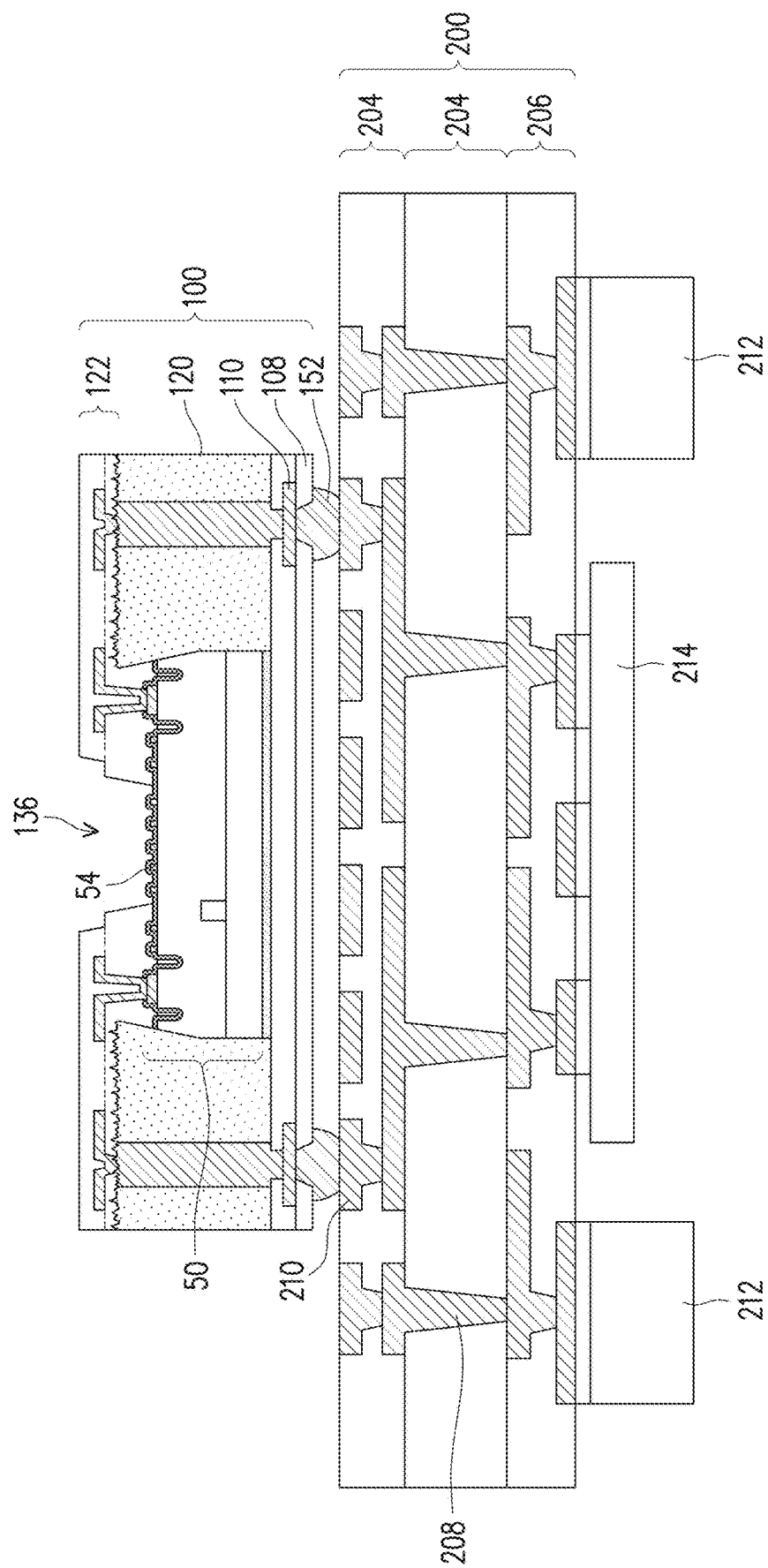
FIG. 18 illustrates a cross-sectional view of formation of a semiconductor package in accordance with some embodiments.

FIG. 18 illustrates formation and implementation of device stacks in accordance with some embodiments. The device stacks are formed from the integrated circuit packages formed in the first package component 100. The device stacks may also be referred to as package-on-package (PoP) structures. The first package component 100 is coupled to a second package component 200 using the conductive connectors 152. In some embodiments not illustrated, more than one of the first package components 100 may be coupled to the second package component 200 using the conductive connectors 152.

In some embodiments, the second package component 200 may comprise an interpose or a package substrate and may include a substrate 202, an upper redistribution structure 204, and a lower redistribution structure 206, such that the substrate 202 is interposed between the upper redistribution structure 204 and the lower redistribution structure 206. The substrate 202 may include through vias 208 to electrically couple the upper redistribution structure 204 to the lower redistribution structure 206. The substrate 202 may be substantially free of active and passive devices.

The substrate 202 may be formed by any suitable method and may include, for example, a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may comprise a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for forming the substrate 202.

In another embodiment, the second package component 200 may be a process controller, such as a digital processing chip (e.g., a multilayer digital processing chip or controller (ML-DPC)). In such embodiments, the second package component 200 is formed on a wafer, and then the wafer is singulated into individual components. The process controller monitors the outputs of the sensing elements 54 of the first package component 100 and controls the functioning of the sensing elements 54 in coordination with the other devices composing the sensing equipment at large. In some embodiments, although not specifically illustrated, the substrate 202 (e.g., a silicon substrate) may include active and passive devices. A wide variety of devices such as transistors, capacitors, resistors, combinations of these, and the like may be used to generate the structural and functional requirements of the design for the second package component 200. The devices may be formed using any suitable methods.

Although not specifically illustrated, the substrate 202 may also include an interconnect structure over the active and passive devices and is designed to connect the active and passive devices to form functional circuitry. The interconnect structure may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In addition, the through vias 208 may extend through the substrate 202 to electrically couple portions of the upper redistribution structure 204 to portions of the lower redistribution structure 206.

The second package component 200 may further have bond pads 210 on an upper side of the upper redistribution structure 204 to electrically and mechanically couple to the conductive connectors 152 of the first package component 100. In some embodiments, the bond pads 210 are formed by forming recesses (not shown) into dielectric layers on the upper side of the upper redistribution structure 204. The recesses may be formed to allow the bond pads 210 to be embedded into the dielectric layers. In other embodiments, the recesses are omitted as the bond pads 210 may be formed on the dielectric layer.

After the second package component 200 is formed, the first package component 100 is mechanically and electrically bonded to the second package component 200 by way of the conductive connectors 152 of the first package component 100 and the upper redistribution structure 204 of the second package component 200.

In some embodiments, a solder resist (not shown) is formed on the upper redistribution structure 204. The conductive connectors 152 may be disposed in openings in the solder resist to be electrically and mechanically coupled to conductive features (e.g., the bond pads 210) in the second package component 200. The solder resist may be used to protect areas of the second package component 200 (e.g., the upper redistribution structure 204) from external damage. In some embodiments, the conductive connectors 152 have an epoxy flux (not shown) formed thereon before they are reflowed with at least some of the epoxy portion of the epoxy flux remaining after the first package component 100 is attached to the second package component 200.

In some embodiments, an underfill (not shown) is formed between the first package component 100 and the second package component 200, surrounding the conductive connectors 152. The underfill may reduce stress and protect the joints resulting from the reflowing of the conductive connectors 152. The underfill may be formed by a capillary flow process after the first package component 100 is attached to the second package component 200, or may be formed by a suitable deposition method before the first package component 100 is attached to the second package component 200. In embodiments where the epoxy flux is formed, it may act as the underfill.

In some embodiments, additional functional components, such as one or more surface mount devices (SMDs) 212 (e.g., capacitors, resistors, inductors, or the like), and an interconnect structure 214 (e.g., a connector) are electrically and mechanical coupled to the second package component 200. In some embodiments when the second package component 200 is a process controller, the second package component 200 is formed on a wafer, and then the wafer is singulated into individual components. The one or more SMDs 212 and the interconnect structure 214 may be attached to the lower redistribution structure 206 before or after the singulation process to form the second package component 200. In some embodiments, the one or more SMDs 212 and the interconnect structure 214 are attached to the lower redistribution structure 206 after the first package component 100 is attached to the upper redistribution structure 204. In the illustrated embodiment, the one or more SMDs 212 and the interconnect structure 214 are attached to the lower redistribution structure 206. In other embodiments, some or all of the one or more SMDs 212 and the interconnect structure 214 may be attached to the upper redistribution structure 204. Although not specifically illustrated, the interconnect structure 214 may be additionally coupled to other packages or devices.

The first package component 100 may be implemented in other devices. For example, a PoP structure is shown, but the first package component 100 may also be implemented in a Flip Chip Ball Grid Array (FCBGA) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. The formation of the insulating layer 68 as described above may improve efficiency and yield of the overall manufacturing process. In particular, the insulating layer 68 is formed to be stable during subsequent processing. For example, the insulating layer 68 has a high glass transition temperature and decomposition temperature, which allow the insulating layer 68 to maintain a substantially same composition, robust adhesion to the substrate 52 and the passivation film 64, and avoid deformation during subsequent steps that, for example, may use elevated temperatures (e.g., formation of the encapsulant 120). The good tensile strength and high Young's Modulus provide additional durability and adhesion to the substrate 52 and the passivation films 64 during subsequent planarization (e.g., grinding) of the encapsulant 120. In addition, the particular composition of the insulating layer 68 (e.g., a polyimide with an ester group) facilitates fast and efficient removal using a wet etching process.

In accordance with an embodiment, a package includes an integrated circuit die. A sidewall of the integrated circuit die has a first facet and a second facet. The first facet and the second facet have different slopes. The package includes an encapsulant surrounding the integrated circuit die and in physical contact with the first facet and the second facet and an insulating layer over the integrated circuit die and the encapsulant. An upper surface of the integrated circuit die is lower than an upper surface of the encapsulant. A sidewall of the insulating layer is substantially coplanar with the first facet.

Embodiments may include one or more of the following features. The package further including a through via extending through the encapsulant adjacent to the integrated circuit die. The package where a width of the insulating layer increases as the insulating layer extends from the upper surface of the encapsulant toward the upper surface of the integrated circuit die. The package further including a redistribution layer over the insulating layer, where a portion of the redistribution layer extends through the insulating layer and is electrically coupled to the integrated circuit die. The package where a roughness of the upper surface of the encapsulant is between about 0.5 μm and about 0.7 μm. The package where the first facet and the upper surface of the integrated circuit die form a first angle, and where the first angle is between about 50° and about 70°. The package where the second facet is substantially perpendicular to the upper surface of the integrated circuit die.

In accordance with another embodiment, a package includes an integrated circuit die, an encapsulant in physical contact with sidewalls of the integrated circuit die, and a first redistribution structure over the integrated circuit die and the encapsulant. A first interface between the encapsulant and the integrated circuit die includes a first portion having a first slope and a second portion having a second slope different from the first slope. The first redistribution structure includes an insulating layer having a first portion extending along an upper surface of the encapsulant and a second portion extending from the upper surface of the encapsulant toward the integrated circuit die. A second interface between the second portion of the insulating layer and the encapsulant is substantially coplanar with the first portion of the first interface.

Embodiments may include one or more of the following features. The package further including a second redistribution structure, where the integrated circuit die is interposed between the first redistribution structure and the second redistribution structure. The package further including a through via extending though the encapsulant adjacent to the integrated circuit die, where the through via electrically couples the first redistribution structure to the second redistribution structure. The package where a roughness of an upper surface of the through via is between about 0.02 μm and about 0.2 μm. The package where a roughness of a third interface between the first portion of the insulating layer and the encapsulant is between about 0.5 μm and about 0.7 μm. The package where the first portion of the first interface and an upper surface of the integrated circuit die form a first angle, and where the first angle is between about 50° and about 70°. The package where the second portion of the first interface is substantially perpendicular to the upper surface of the integrated circuit die.

In accordance with yet another embodiment, a method includes attaching an integrated circuit die to a first insulating layer. The integrated circuit die includes a substrate, a pad over the substrate, and a second insulating layer over the pad and the substrate. A sidewall of the substrate has a first facet and a second facet. The first facet and the second facet have different slopes. A sidewall of the second insulating layer is substantially coplanar with the first facet. The method further includes forming an encapsulant around the integrated circuit die, and removing the second insulating layer to form a first opening in the encapsulant.

Embodiments may include one or more of the following features. The method where the second insulating layer includes a polyimide with an ester group. The method where removing the second insulating layer includes performing a wet etch process. The method where the wet etch process is performed using a solution including tetramethylammonium hydroxide (TMAH), dimethyl sulfoxide (DMSO), and water. The method further including forming a redistribution structure over the integrated circuit die and the encapsulant, where a third insulating layer of the redistribution structure fills the first opening. The method further including forming a second opening in the redistribution structure, where the second opening exposes the integrated circuit die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    attaching an integrated circuit die to a first insulating layer, the integrated circuit die comprising:
        a substrate, a sidewall of the substrate having a first facet and a second facet, the first facet and the second facet having different slopes;
        a pad over the substrate; and
        a second insulating layer over the pad and the substrate, a sidewall of the second insulating layer being substantially coplanar with the first facet, wherein the second insulating layer comprises a polymer, the polymer having the following structure:

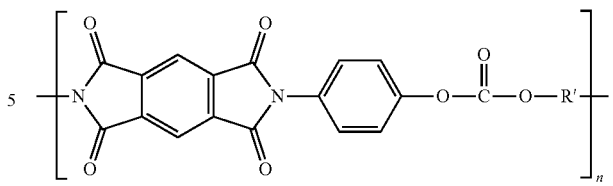

forming an encapsulant around the integrated circuit die; and
    removing the second insulating layer to form a first opening in the encapsulant.

2. The method of claim 1, wherein removing the second insulating layer comprises performing a wet etch process.

3. The method of claim 2, wherein the wet etch process is performed using a solution comprising tetramethylammonium hydroxide (TMAH), dimethyl sulfoxide (DMSO), and water.

4. The method of claim 1, further comprising forming a redistribution structure over the integrated circuit die and the encapsulant, wherein a third insulating layer of the redistribution structure fills the first opening.

5. The method of claim 4, further comprising forming a second opening in the redistribution structure, wherein the second opening exposes the integrated circuit die.

6. The method of claim 1, wherein after removing the second insulating layer a surface of the encapsulant has a roughness between 0.1 μm and 0.2 μm.

7. The method of claim 1, further comprising:
    forming through vias on the first insulating layer, wherein forming the encapsulant comprises forming the encapsulant along sidewalls of the through vias.

8. A method comprising:
    forming a first die and a second die on a wafer, wherein the first die comprises a first substrate, a first interconnect structure over the first substrate, a first contact pad over the first interconnect structure, and a first sacrificial layer over the first contact pad, wherein the second die comprises a second substrate, a second interconnect structure over the second substrate, a second contact pad over the second interconnect structure, and a second sacrificial layer over the second contact pad;
    singulating the first die from the second die, wherein an upper sidewall of the first die is beveled;
    placing the first die on a substrate;
    forming an encapsulant over the substrate, the encapsulant extending along sidewalls of the first interconnect structure and the first sacrificial layer;
    fully removing the first sacrificial layer to expose the first contact pad; and
    forming a conductive feature contacting the first contact pad.

9. The method of claim 8, further comprising:
    after removing the first sacrificial layer, forming an insulating layer over the first contact pad; and
    forming a first opening through the insulating layer, wherein the conductive feature extends through the first opening to the first contact pad.

10. The method of claim 9, wherein the conductive feature extends over an upper surface of the insulating layer.

11. The method of claim 9, wherein the first die comprises sensing elements over the first interconnect structure, wherein forming the insulating layer comprises forming the insulating layer over the sensing elements, further comprising:

forming a second opening to expose the sensing elements.

12. The method of claim 9, wherein the insulating layer comprises a carbonyl group including an ester group.

13. The method of claim 8, wherein singulating comprises forming a groove between the first die and the second die, wherein the groove has a first width at a top of the groove, wherein the groove has a second width at a bottom of the groove, wherein the second width is less than the first width.

14. The method of claim 13, wherein the second width is about 65% of the first width.

15. A method comprising:
forming a first redistribution structure on a carrier substrate;
forming a through via on the first redistribution structure;
attaching a first die to the first redistribution structure, the first die comprising a substrate, an interconnect structure over the substrate, and a first insulating layer over the interconnect structure, an upper sidewall of the first insulating layer being tapered with respect to a lower sidewall of the substrate;
forming an encapsulant over the first redistribution structure, wherein the first insulating layer is exposed;
removing at least a portion of the first insulating layer to expose a sidewall of the encapsulant, the sidewall of the encapsulant facing the interconnect structure;
forming a second insulating layer over the encapsulant and over the interconnect structure;
forming a first opening in the second insulating layer to expose a contact pad of the first die; and
forming an electrical contact in the opening.

16. The method of claim 15, wherein an angle between the upper sidewall of the first insulating layer and a major surface of the interconnect structure is between 50° and 70°.

17. The method of claim 15, wherein removing at least the portion of the first insulating layer roughens a surface of the encapsulant and a surface of the through via.

18. The method of claim 15, wherein the second insulating layer directly contacts a sidewall of the encapsulant.

19. The method of claim 15, wherein the first die comprises sensors along a top surface of the interconnect structure, further comprising:
forming a second opening in the second insulating layer to expose the sensors.

20. The method of claim 8, wherein the first sacrificial layer comprises a polyimide with an ester group.

* * * * *